(12) United States Patent
Patil et al.

(10) Patent No.: US 11,444,019 B2
(45) Date of Patent: Sep. 13, 2022

(54) PACKAGE COMPRISING A SUBSTRATE WITH INTERCONNECT ROUTING OVER SOLDER RESIST LAYER AND AN INTEGRATED DEVICE COUPLED TO THE SUBSTRATE AND METHOD FOR MANUFACTURING THE PACKAGE

(71) Applicant: QUALCOMM Incorporated, San Diego, CA (US)

(72) Inventors: Aniket Patil, San Diego, CA (US); Hong Bok We, San Diego, CA (US); Kuiwon Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 86 days.

(21) Appl. No.: 16/840,752

(22) Filed: Apr. 6, 2020

(65) Prior Publication Data

US 2021/0313266 A1 Oct. 7, 2021

(51) Int. Cl.
*H01L 23/522* (2006.01)
*H01L 21/56* (2006.01)
(Continued)

(52) U.S. Cl.
CPC ........ *H01L 23/5226* (2013.01); *H01L 21/563* (2013.01); *H01L 23/3157* (2013.01);
(Continued)

(58) Field of Classification Search
CPC ............. H01L 23/5226; H01L 23/3157; H01L 23/49894; H01L 23/5383; H01L 23/5389;
(Continued)

(56) References Cited

U.S. PATENT DOCUMENTS 8,610,134 B2   12/2013  Andrews
9,640,505 B2    5/2017  Lin et al.
(Continued)

FOREIGN PATENT DOCUMENTS

EP      3346492 A2    7/2018
WO   2015138359 A1    9/2015

OTHER PUBLICATIONS

International Search Report and Written Opinion—PCT/US2021/025822—ISA/EPO—dated Oct. 8, 2021.

*Primary Examiner* — Khiem D Nguyen
(74) *Attorney, Agent, or Firm* — Qualcomm Incorporated

(57) ABSTRACT

A package comprising a substrate and an integrated device coupled to the substrate. The substrate includes (i) at least one inner dielectric layer, (ii) a plurality of interconnects located in the at least one inner dielectric layer, where the plurality of interconnects includes a pad located on a bottom metal layer of the substrate, (iii) an outer dielectric layer located over the at least one dielectric layer, (iv) at least one routing interconnect coupled to the plurality of interconnects, where the at least one routing interconnect is located over the outer dielectric layer, where the at least one routing interconnect is located below the bottom metal layer of the substrate, and (v) a cover dielectric layer located over the outer dielectric layer and the at least one routing interconnect. The package includes a solder interconnect coupled to the pad located on the bottom metal layer of the substrate.

28 Claims, 21 Drawing Sheets

*PROFILE VIEW*

(51) Int. Cl.
  *H01L 23/31*   (2006.01)
  *H01L 23/498*  (2006.01)
  *H01L 23/538*  (2006.01)
  *H01L 23/00*   (2006.01)

(52) U.S. Cl.
  CPC .... *H01L 23/49894* (2013.01); *H01L 23/5383* (2013.01); *H01L 23/5389* (2013.01); *H01L 24/16* (2013.01); *H01L 24/29* (2013.01); *H01L 24/32* (2013.01); *H01L 2224/13001* (2013.01); *H01L 2224/16238* (2013.01); *H01L 2224/32151* (2013.01); *H01L 2924/181* (2013.01)

(58) Field of Classification Search
  CPC ......... H01L 24/16; H01L 24/29; H01L 24/32; H01L 2224/16238; H01L 2224/32151; H01L 2225/1058; H01L 2224/13011; H01L 2224/16227
  USPC ........................................................ 257/773
  See application file for complete search history.

(56) References Cited

U.S. PATENT DOCUMENTS

| | | | |
|---|---|---|---|
| 9,721,922 | B2 | 8/2017 | Marimuthu et al. |
| 9,972,589 | B1 | 5/2018 | Goh et al. |
| 2015/0116965 | A1* | 4/2015 | Kim .................. H01L 23/5385 361/767 |
| 2016/0358889 | A1* | 12/2016 | Lai ....................... H01L 21/768 |
| 2018/0358292 | A1* | 12/2018 | Kong ................ H01L 23/49822 |
| 2020/0083164 | A1* | 3/2020 | Marin ................. H01L 23/5228 |
| 2020/0294915 | A1* | 9/2020 | Chu ......................... H01L 25/50 |

* cited by examiner

PROFILE VIEW

BOTTOM PLAN VIEW

PROFILE VIEW

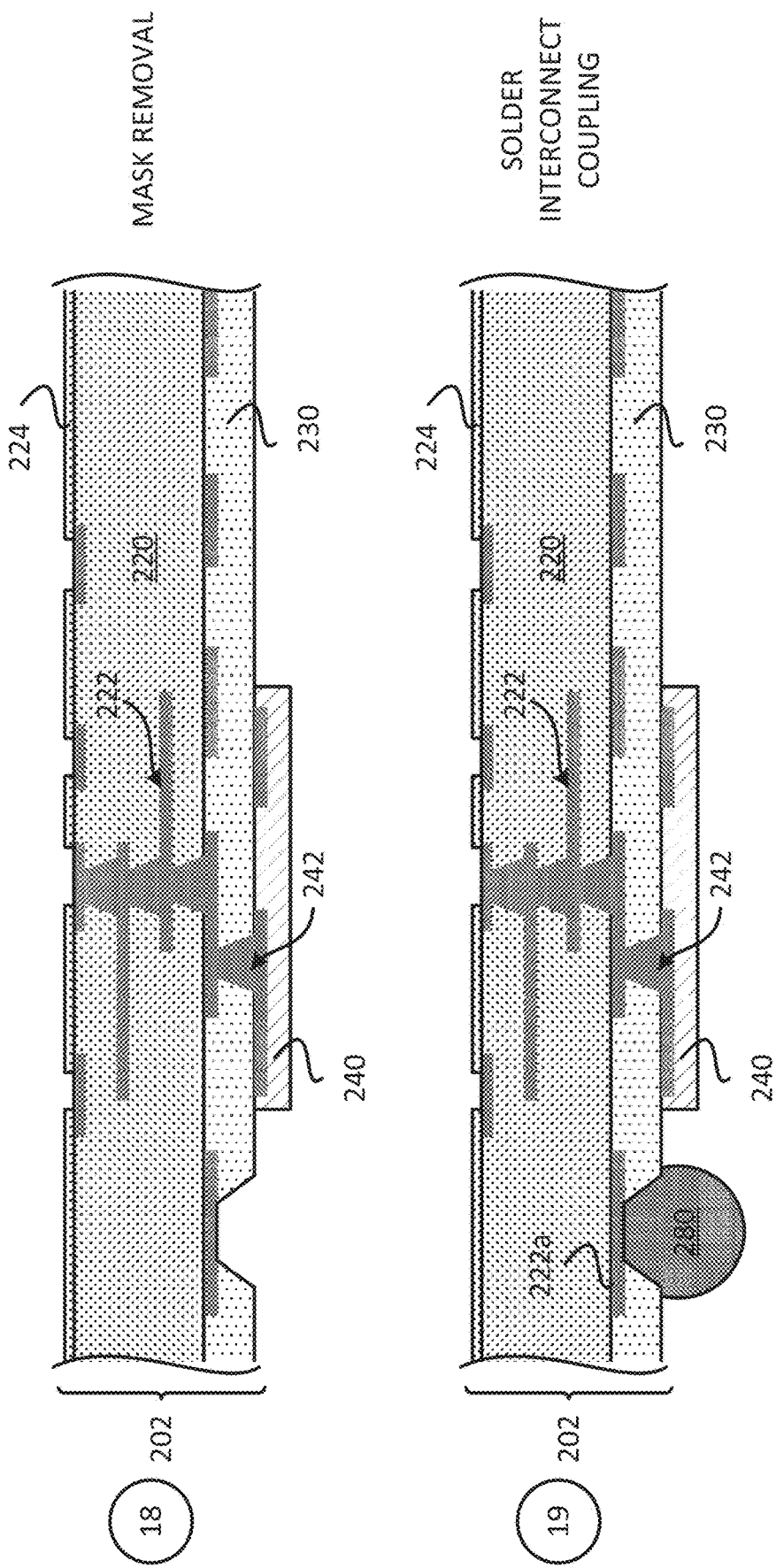

```
┌─────────────────────────────────────────────┐
│ PROVIDE (E.G., FORMING) A SUBSTRATE         │
│ COMPRISING AT LEAST ONE INNER DIELECTRIC    │
│ LAYER, A PLURALITY OF INTERCONNECTS         │
│ LOCATED AT LEAST IN THE AT LEAST ONE INNER  │
│ DIELECTRIC LAYER, AN OUTER DIELECTRIC LAYER │
│ LOCATED OVER THE AT LEAST ONE INNER         │
│ DIELECTRIC LAYER, AT LEAST ONE ROUTING      │─ 905
│ INTERCONNECT, AND A COVER DIELECTRIC LAYER  │
│ LOCATED OVER THE OUTER DIELECTRIC LAYER,    │
│ WHERE THE AT LEAST ONE ROUTING INTERCONNECT │
│ IS COUPLED TO THE PLURALITY OF              │
│ INTERCONNECTS, WHERE THE AT LEAST ONE       │
│ ROUTING INTERCONNECT IS LOCATED OVER THE    │
│ OUTER DIELECTRIC LAYER AND THE BOTTOM METAL │
│ LAYER OF THE SUBSTRATE, AND WHERE THE COVER │
│ DIELECTRIC LAYER IS LOCATED OVER THE AT     │
│ LEAST ONE ROUTING INTERCONNECT AND THE      │
│ OUTER DIELECTRIC LAYER                      │
└─────────────────────────────────────────────┘
                       │
                       ▼
┌─────────────────────────────────────────────┐
│ COUPLE SOLDER INTERCONNECTS TO              │
│ THE SUBSTRATE (E.G., TO PAD LOCATED ON THE  │─ 910
│ BOTTOM METAL LAYER OF THE SUBSTRATE)        │
└─────────────────────────────────────────────┘
                       │
                       ▼
┌─────────────────────────────────────────────┐
│ COUPLE COMPONENT(S) (E.G., INTEGRATED       │─ 915
│ DEVICE) TO THE SUBSTRATE                    │
└─────────────────────────────────────────────┘
                       │
                       ▼
┌─────────────────────────────────────────────┐
│ FORM ENCAPSULATION LAYER OVER THE FIRST     │
│ SURFACE OF THE SUBSTRATE SUCH THAT THE      │─ 920
│ ENCAPSULATION LAYER ENCAPSULATES THE        │
│ COMPONENT(S)                                │
└─────────────────────────────────────────────┘
```

PROFILE VIEW

PACKAGE COMPRISING A SUBSTRATE
WITH INTERCONNECT ROUTING OVER
SOLDER RESIST LAYER AND AN
INTEGRATED DEVICE COUPLED TO THE
SUBSTRATE AND METHOD FOR
MANUFACTURING THE PACKAGE

FIELD

Various features relate to packages that include an integrated device, but more specifically to a package that includes an integrated device, a substrate, and interconnects located over solder resist layer.

BACKGROUND

FIG. 1 illustrates a package 100 that includes a substrate 102, an integrated device 104, and an encapsulation layer 108. The substrate 102 includes at least one dielectric layer 120, a plurality of interconnects 122, and a plurality of solder interconnects 124. A plurality of solder interconnects 144 is coupled to the substrate 102 and the integrated device 104. The encapsulation layer 108 encapsulates the integrated device 104 and the plurality of solder interconnects 144. Fabricating a small package that includes a substrate with high density interconnects can be challenging. There is an ongoing need to provide more compact packages that can accommodate high density interconnects and/or high pin counts.

SUMMARY

Various features relate to packages that include an integrated device, but more specifically to a package that includes an integrated device, a substrate, and interconnects located over solder resist layer.

One example provides a package comprising a substrate and an integrated device coupled to the substrate. The substrate includes (i) at least one inner dielectric layer, (ii) a plurality of interconnects located in the at least one inner dielectric layer, where the plurality of interconnects includes a pad located on a bottom metal layer of the substrate, (iii) an outer dielectric layer located over the at least one inner dielectric layer, (iv) at least one routing interconnect coupled to the plurality of interconnects, where the at least one routing interconnect is located over the outer dielectric layer, where the at least one routing interconnect is located over the bottom metal layer of the substrate, and (v) a cover dielectric layer located over the outer dielectric layer and the at least one routing interconnect. The package includes a solder interconnect coupled to the pad located on the bottom metal layer of the substrate.

Another example provides a package comprising a substrate and an integrated device coupled to the substrate. The substrate includes (i) at least one inner dielectric layer, (ii) a plurality of interconnects located in the at least one inner dielectric layer, where the plurality of interconnects includes a pad located on a bottom metal layer of the substrate, (iii) an outer dielectric layer located over the at least one inner dielectric layer, (iv) means for routing interconnect coupled to the plurality of interconnects, where the means for routing interconnect is located over the outer dielectric layer, where the means for routing interconnect is located over the bottom metal layer of the substrate, and (v) a cover dielectric layer located over the outer dielectric layer and the means for routing interconnect. The package includes a solder interconnect coupled to the pad located on the bottom metal layer of the substrate.

Another example provides a method for fabricating package. The method provides a substrate. The substrate includes (i) at least one inner dielectric layer; (ii) a plurality of interconnects located in the at least one inner dielectric layer, wherein the plurality of interconnects includes a pad located on a bottom metal layer of the substrate; (iii) an outer dielectric layer located over the at least one inner dielectric layer; (iv) at least one routing interconnect coupled to the plurality of interconnects, wherein the at least one routing interconnect is located over the outer dielectric layer, wherein the at least one routing interconnect is located over the bottom metal layer of the substrate, and (v) a cover dielectric layer located over the outer dielectric layer and the at least one routing interconnect. The method couples an integrated device to the substrate. The method couples a solder interconnect to the pad located on the bottom metal layer of the substrate.

Another example provides a package comprising a substrate and an integrated device coupled to the substrate. The substrate includes (i) at least one inner dielectric layer, (ii) a plurality of interconnects located in the at least one inner dielectric layer, where the plurality of interconnects includes a pad located on a bottom metal layer of the substrate, (iii) an outer dielectric layer located over the at least one inner dielectric layer, (iv) a cover dielectric layer located over the at least one inner dielectric layer, (v) at least one routing interconnect coupled to the plurality of interconnects, where the at least one routing interconnect is located over the cover dielectric layer, where the at least one routing interconnect is located over the bottom metal layer of the substrate, and (vi) a second outer dielectric layer located over the cover dielectric layer and the at least one routing interconnect. The package includes a solder interconnect coupled to the pad located on the bottom metal layer of the substrate.

BRIEF DESCRIPTION OF THE DRAWINGS

Various features, nature and advantages may become apparent from the detailed description set forth below when taken in conjunction with the drawings in which like reference characters identify correspondingly throughout.

FIG. 9 illustrates an exemplary flow diagram of a method for fabricating a package that includes a substrate with interconnects located over a solder resist layer.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device coupled to the substrate. The substrate includes (i) at least one inner dielectric layer, (ii) a plurality of interconnects located at least in the at least one inner dielectric layer, where the plurality of interconnects includes a pad located on a bottom metal layer of the substrate, (iii) an outer dielectric layer located over the at least one inner dielectric layer, (iv) at least one routing interconnect coupled to the plurality of interconnects, where the at least one routing interconnect is located over the outer dielectric layer, where the at least one routing interconnect is located over the bottom metal layer of the substrate, and (v) a cover dielectric layer located over the outer dielectric layer and the at least one routing interconnect, the cover dielectric layer may be coupled to the outer dielectric layer. The package includes a solder interconnect coupled to the pad located on the bottom metal layer of the substrate. The outer dielectric layer may include a solder resist layer or photo imageable dielectric (PID). The cover dielectric layer may include a solder resist layer or photo imageable dielectric (PID). The at least one routing interconnect may be located (e.g., laterally located) between a plurality of solder interconnects. The integrated device and the substrate are coupled together in such a way that a first electrical signal to and/or from the integrated device, may be configured to travel through the plurality of interconnects and the at least routing interconnect located over the outer dielectric layer substrate. This configuration where the at least one routing interconnect is located over an outer dielectric layer and between solder interconnects, may allow the space (e.g., lateral space) between solder interconnects of the substrate to be utilized for routing, providing more routing real estate without increasing the overall size and form of the substrate and/or the package.

Figure 1:
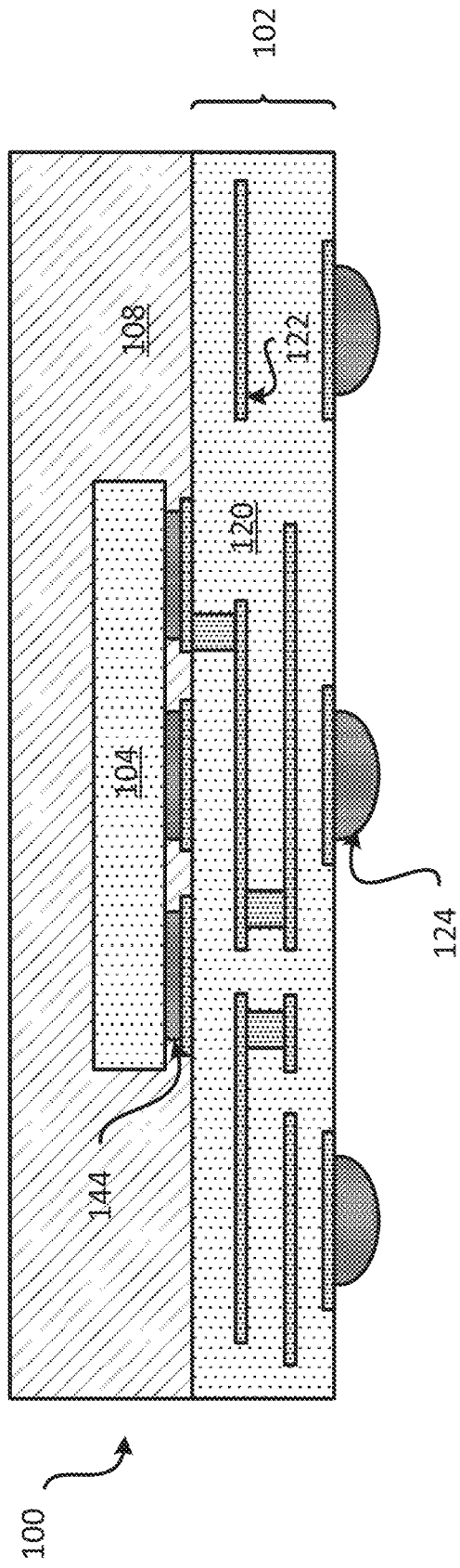
FIG. 1 illustrates a profile view of a package that includes an integrated device and a substrate.
Figure 2:
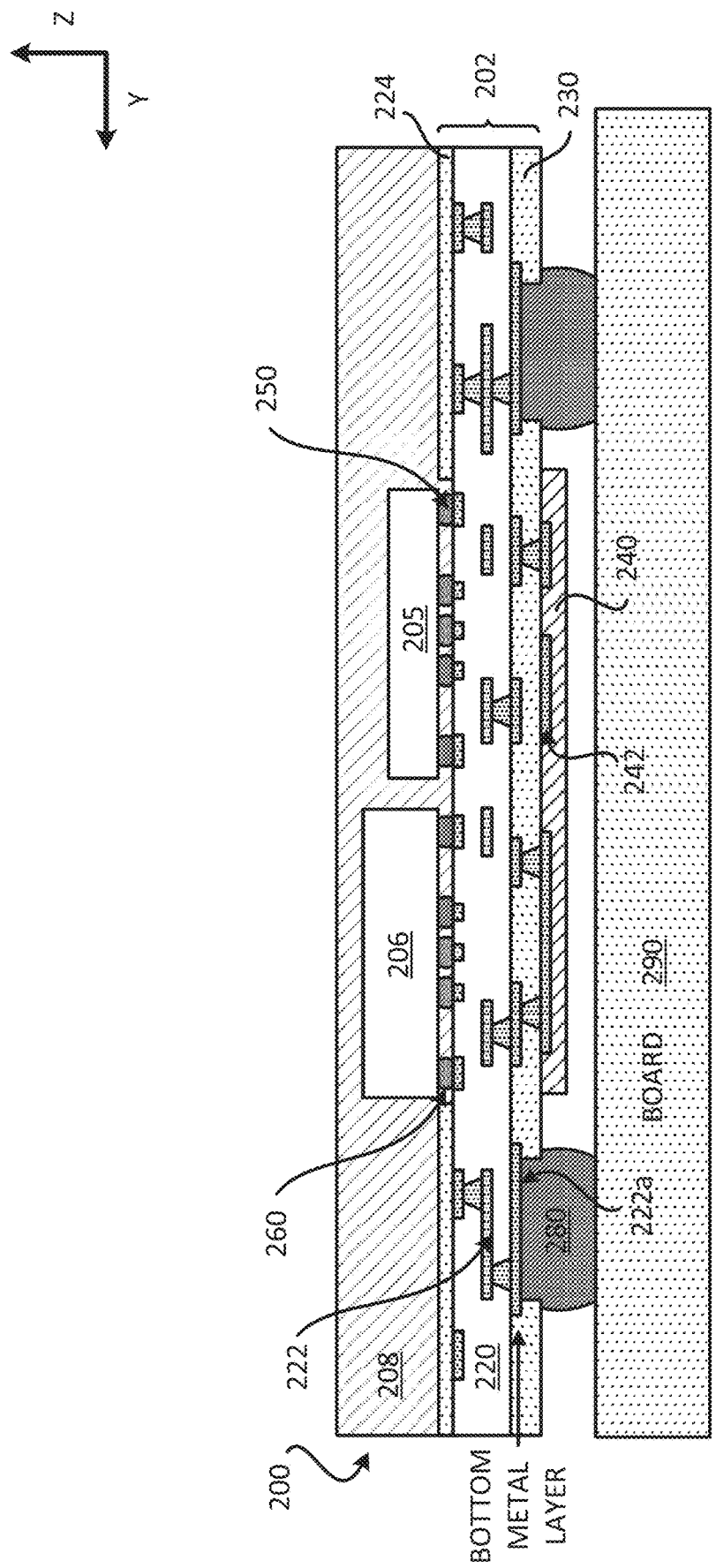
FIG. 2 illustrates a profile view of a package that includes a substrate with interconnects located over a solder resist layer.

Exemplary Package Comprising a Substrate with Interconnects Located Over an Outer Dielectric Layer FIG. 2 illustrates a profile view of a package 200 that includes interconnects located over an outer dielectric layer. The package 200 is coupled to a board 290 (e.g., printed circuit board (PCB)) through a plurality of solder interconnects 280. The package 200 provides a package with a compact small factor while also having an improved routing interconnect design.

As shown in FIG. 2, the package 200 includes a substrate 202, a first integrated device 205, a second integrated device 206, an encapsulation layer 208 and the plurality of solder interconnects 280.

The substrate 202 includes a first surface (e.g., top surface) and a second surface (e.g., bottom surface). The substrate 202 includes at least one inner dielectric layer 220, a plurality of interconnects 222, a solder resist layer 224, an outer dielectric layer 230, a cover dielectric layer 240, and at least one routing interconnect 242. The plurality of interconnects 222 is located at least in and over the at least one inner dielectric layer 220. The plurality of interconnects 222 includes at least one pad 222a located on a bottom metal layer of the substrate 202. The pad 222a is configured to be coupled to a solder interconnect from the plurality of solder interconnects 280. The outer dielectric layer 230 is located over the at least one inner dielectric layer 220. The at least one routing interconnect 242 is coupled to the plurality of interconnects 222. The at least one routing interconnect 242 is located over the outer dielectric layer 230. The at least one routing interconnect 242 is located over (or under, depending on how top and bottom are arbitrarily defined) the bottom metal layer of substrate 202. The at least one routing interconnect 242 may be located between the bottom metal layer of substrate 202 and the board 290. The cover dielectric layer 240 is located over the outer dielectric layer 230 and the at least one routing interconnect 242. The at least one routing interconnect 242 may be means for routing interconnect. The cover dielectric layer 240 may be coupled to the outer dielectric layer 230.

As used in the disclosure, when a particular dielectric layer is located "over" another dielectric layer, the particular dielectric layer may be located above or below the another dielectric layer, depending on how a bottom (e.g., bottom layer) or top (e.g., top layer) is arbitrarily defined. A particular dielectric layer that is located "over" another dielectric layer (whether above or below) may mean that the particular dielectric layer is coupled to a surface of the another dielectric layer. For example, a surface of the particular dielectric layer may be in contact (e.g., touching) with another surface of the another dielectric layer.

The outer dielectric layer 230 may be coupled and located over (e.g., below) a bottom surface of the at least one inner dielectric layer 220. The at least one routing interconnect 242 and the cover dielectric layer 240 may be coupled and located over (e.g., below) a bottom surface of the outer dielectric layer 230. The at least one routing interconnect 242 may be located laterally between the plurality of solder interconnects 280. The at least one routing interconnect 242 may be free of direct contact with the plurality of solder interconnects 280. The at least one routing interconnect 242 may be coupled to the plurality of interconnects 222. The outer dielectric layer 230, the cover dielectric layer 240 and the at least one routing interconnect 242 may be part of the substrate 202.

The bottom metal layer of the substrate 202 may be a metal layer of the substrate 202 that includes interconnects (such as pads) that are configured to be coupled to solder interconnects. The bottom metal layer of the substrate 202 may not be necessarily the lowest metal layer of the substrate 202 or the metal layer of the substrate 202 that is closest to a board (when the substrate 202 is coupled to a board). In the example of FIG. 2, the bottom metal layer of the substrate 202 may be the metal layer that includes the interconnects (such as pad 222a) that are coupled (e.g., directly coupled) to the plurality of solder interconnects 280. The plurality of solder interconnects 280 is further coupled to the board 290 (e.g., printed circuit board). The bottom metal layer of the substrate 202 may be a metal layer that is closest (e.g., vertically closest) to the plurality of solder interconnects 280 without being laterally positioned (e.g., along X-axis and/or Y-axis) along a same plane as the plurality of solder interconnects 280. For the purpose of the disclose, a bottom metal layer of a substrate may be defined as to not include metal layer(s) that are located laterally to the plurality of solder interconnects 280.

As shown in FIG. 2, the plurality of solder interconnects 280 is coupled to the substrate 202 (e.g., coupled to the bottom metal layer of the substrate 202) such that the at least one routing interconnect 242 is located laterally to the plurality of solder interconnects 280 and/or located between the plurality of solder interconnects 280.

The use of the at least one routing interconnect 242 helps save space and helps reduce the overall height and footprint of the package 200, utilizing space that would not otherwise be used. Moreover, the use of the at least one routing interconnect 242 may help reduce routing congestion (e.g., local routing congestion) in the substrate 202. This configuration where the at least one routing interconnect 242 is located between the solder interconnects 280 (but may not be in direct contact with the solder interconnects), uses a space that would otherwise not be used. In particular, this configuration may allow the space (e.g., lateral space) between solder interconnects 280 of the substrate 202 to be utilized for routing, providing more routing real estate without increasing the overall size and form of the substrate and/or the package.

It is noted that the at least one routing interconnect 242 may also be formed over another surface (e.g., top surface) of the substrate 202. In such an instance, another cover dielectric layer and/or outer dielectric may be formed over the second surface of the substrate 202. Thus, in some implementations, at least one routing interconnect, a cover dielectric layer and/or an outer dielectric layer may be formed over a bottom surface and/or a top surface of the substrate 202.

The outer dielectric layer 230 may include a different material than the at least one inner dielectric layer 220. The cover dielectric layer 240 may include a different material than the at least one inner dielectric layer 220. The cover dielectric layer 240 may include a different material than the at least one inner dielectric layer 220 and the outer dielectric layer 230. The cover dielectric layer 240 and the outer dielectric layer 230, may each include a different material than the at least one inner dielectric layer 220. The cover dielectric layer 240 and the outer dielectric layer 230 may include the same material.

The at least one inner dielectric layer 220 may include a copper clad laminate (CCL) core, a prepreg, an ajinomoto build up film (ABF), and/or a resin coated copper (RCC). The outer dielectric layer 230 may include a solder resist layer and/or a photo imageable dielectric (PID). The cover dielectric layer 240 may include a solder resist layer and/or a photo imageable dielectric (PID).

The first integrated device 205 is coupled to a first surface (e.g., top surface) of the substrate 202 through a plurality of interconnects 250. The plurality of interconnects 250 may include copper pillars and/or solder interconnects. The second integrated device 206 is coupled to the first surface of the substrate 202 through a plurality of interconnects 260. The plurality of interconnects 260 may include copper pillars and/or solder interconnects. The encapsulation layer 208 is located over and coupled to the first surface of the substrate 202 and may encapsulate the first integrated device 205 and the second integrated device 206. The encapsulation layer 208 may include a mold, a resin, an epoxy and/or polymer. The encapsulation layer 208 may be means for encapsulation.

The integrated device (e.g., 205, 206) may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon carbide (SiC) based integrated device, memory, and/or combinations thereof.

Different implementations may couple different components to the substrate 202. Other components (e.g., surface mounted components) that may be coupled to the substrate 202 include a passive device (e.g., capacitor).

Some electrical signals (e.g., first electrical signal, second electrical signals) to and from integrated devices (e.g., 205, 206) may travel through the plurality of interconnects 222 and the at least one routing interconnect 242. For example, some signals to and/or from an integrated device may travel through a first plurality of interconnects from the plurality of interconnects 222, the at least one routing interconnect 242 and a second plurality of interconnects from the plurality of interconnects 222. The at least one routing interconnect 242 may allow the package 200 to provide higher I/O pin counts, without having to increase the size of the package 200. For example, using the at least one routing interconnect 242 may allow the substrate 202 to have a lower number of metal layers, which may help reduce the overall height of the package 200. The at least one routing interconnect 242 may help reduce congestion and/or entanglement in certain regions (e.g., regions near an integrated device) of the substrate 202 due to the high number of pin count and/or number of netlists. A netlist is an arrangement of components of a circuit and how the components are electrically coupled together.

Different implementations may include a substrate that includes a different number of metal layers. Moreover, different implementations may include a substrate that have different shapes and/or sizes. The substrate 202 may include a core layer. The substrate 202 may be a coreless substrate. The substrate 202 may be fabricated using different fabrication processes, including a semi-additive process (SAP) and a modified semi-additive process (mSAP). The plurality of interconnects 222 and the at least one routing interconnect 242 may have different shapes and/or sizes. In some implementations, the plurality of interconnects 222 may include a redistribution interconnect. In some implementations, the at least one routing interconnect 242 may include at least one routing redistribution interconnect. A redistribution interconnect may be fabricated using redistribution layer (RDL) fabrication process. Examples of a method for fabricating a substrate are illustrated and described below in FIGS. 5A-5F and 6A-6B.

Figure 3:
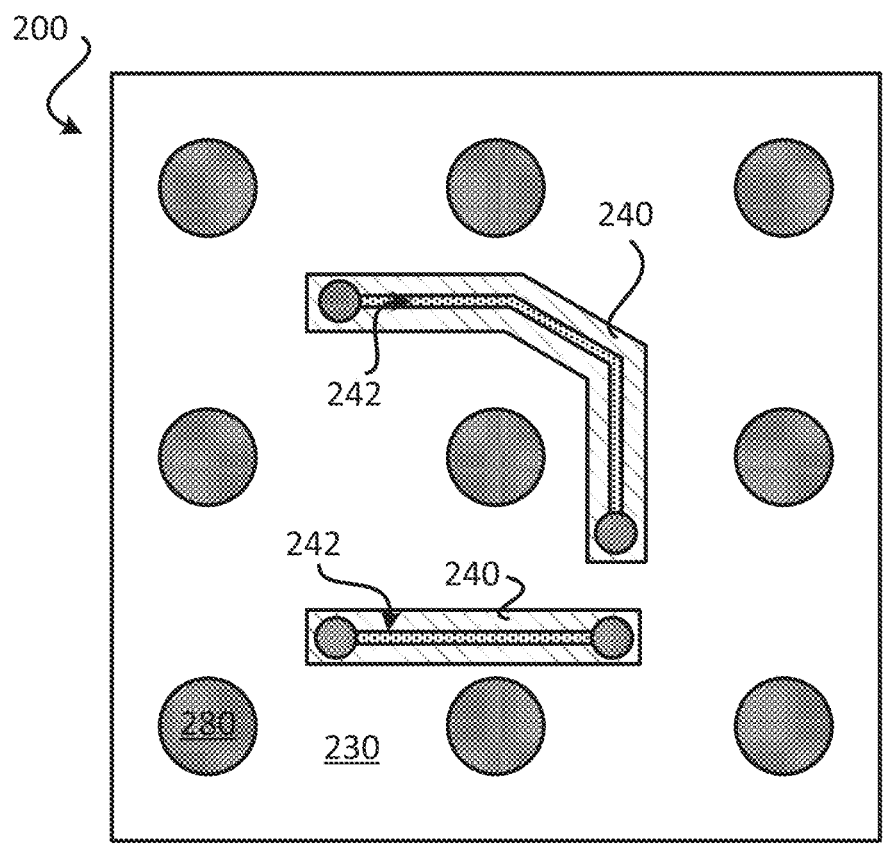
FIG. 3 illustrates a bottom plan view of a package that includes a substrate with interconnects located over a solder resist layer.

FIG. 3 illustrates an exemplary bottom plan view of the package 200. As shown in FIG. 3, the plurality of solder interconnects 280 is coupled to the substrate 202. The substrate 202 includes the outer dielectric layer 230, the at least one routing interconnect 242 and the cover dielectric layer 240. The at least one routing interconnect 242 is located over the outer dielectric layer 230. The cover dielectric layer 240 is located over the at least one routing interconnect 242 and the outer dielectric layer 230. The at least one routing interconnect 242 is located (e.g., laterally located) between the plurality of solder interconnects 280. The at least one routing interconnect 242, which may include at least one routing pad, at least one routing trace and/or at least one routing via, may travel in and/or along a surface of the outer dielectric layer 230. The at least one routing interconnect 242 may be located (e.g., located laterally) between the plurality of solder interconnects 280.

Figure 4:
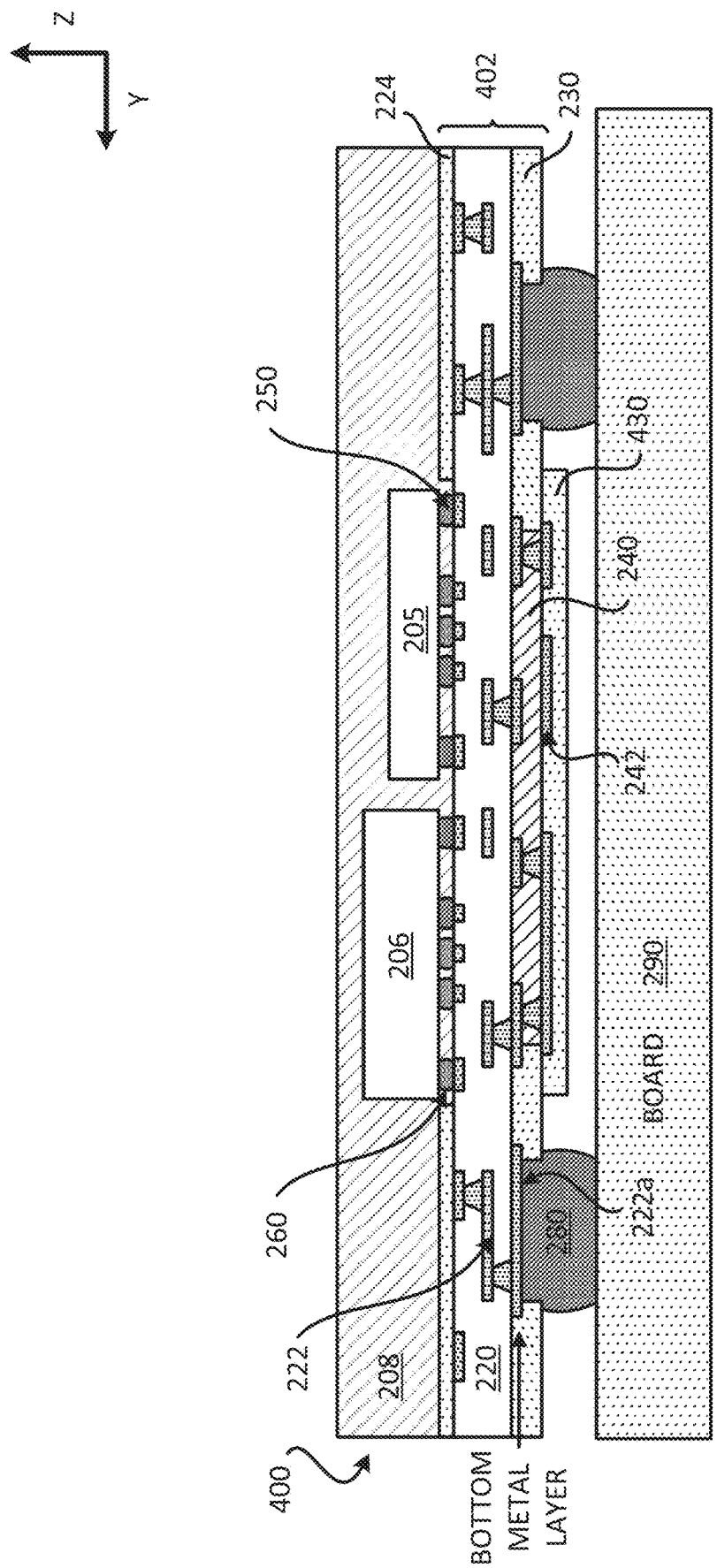
FIG. 4 illustrates a profile view of a package that includes a substrate with interconnects located over an outer dielectric layer.

FIG. 4 illustrates a package 400 that includes the substrate 402. The package 400 is similar to the package 200, and thus includes similar components as the package 200. The substrate 402 is similar to the substrate 202, and thus includes similar components as the substrate 202. The substrate 402 includes a first surface (e.g., top surface) and a second surface (e.g., bottom surface). The substrate 402 includes at least one inner dielectric layer 220, a plurality of interconnects 222, a solder resist layer 224, an outer dielectric layer 230, an outer dielectric layer 430, a cover dielectric layer 240, and at least one routing interconnect 242. The plurality of interconnects 222 is located at least in and over the at least one inner dielectric layer 220. The plurality of interconnects 222 includes at least one pad 222a located on a bottom metal layer of the substrate 402. The pad 222a is configured to be coupled to a solder interconnect from the plurality of solder interconnects 280. The at least one routing interconnect 242 is coupled to the plurality of interconnects 222. The at least one routing interconnect 242 is located over the cover dielectric layer 240. The at least one routing interconnect 242 is located over (or under, depending on how top and bottom are arbitrarily defined) the bottom metal layer of substrate 402. The outer dielectric layer 230 may be located over the at least one inner dielectric layer 220. The outer dielectric layer 230 may be located laterally to the cover dielectric layer 240. The outer dielectric layer 430 is located over the cover dielectric layer 240 and the at least one routing interconnect 242. The outer dielectric layer 430 may be a second outer dielectric layer. The outer dielectric layer 430 may be considered part of the outer dielectric layer 230, and vice versa. Thus, in some implementations, an outer dielectric layer (which may include the outer dielectric layer 230 and the outer dielectric layer 430) may be located over (e.g., below) the at least one inner dielectric layer 220, the cover dielectric layer 240, and the at least one routing interconnect 242. The cover dielectric laser 240 may located between the at least one inner dielectric layer 220 and the outer dielectric layer 430. The cover dielectric laser 240 may be coupled to the at least one inner dielectric layer 220 and the outer dielectric layer 430.

As used in the disclosure, when a particular dielectric layer is located "over" another dielectric layer, the particular dielectric layer may be located above or below the another dielectric layer, depending on how a bottom (e.g., bottom layer) or top (e.g., top layer) is arbitrarily defined. A particular dielectric layer that is located "over" another dielectric layer (whether above or below) may mean that the particular dielectric layer is coupled to a surface of the another dielectric layer. For example, a surface of the particular dielectric layer may be in contact (e.g., touching) with another surface of the another dielectric layer.

The outer dielectric layer 230 may be coupled and located over (e.g., below) a bottom surface of the at least one inner dielectric layer 220. The cover dielectric layer 240 may be coupled and located over (e.g., below) a bottom surface of the at least one inner dielectric layer 220. The cover dielectric layer 240 may be co-planar to the outer dielectric layer 230. The at least one routing interconnect 242 may be coupled and located over (e.g., below) a bottom surface of the cover dielectric layer 240. The outer dielectric layer 430 may be located over (e.g., below) the at least one routing interconnect 242 and a bottom surface of the cover dielectric layer 240. The at least one routing interconnect 242 may be located laterally between the plurality of solder interconnects 280. The at least one routing interconnect 242 may be free of direct contact with the plurality of solder interconnects 280. The at least one routing interconnect 242 may be coupled to the plurality of interconnects 222. The outer dielectric layer 230, the outer dielectric layer 430, the cover dielectric layer 240 and the at least one routing interconnect 242 may be part of the substrate 402.

It is noted that the at least one routing interconnect 242 may also be formed over the first surface (e.g., top surface) of the substrate 402. In such an instance, another cover dielectric layer and/or outer dielectric may be formed over the first surface of the substrate 402. Thus, in some implementations, at least one routing interconnect, a cover dielectric layer and/or an outer dielectric layer may be formed over a bottom surface and/or a top surface of the substrate 402.

The outer dielectric layer (e.g., 230, 430) may include a different material than the at least one inner dielectric layer 220. The cover dielectric layer 240 may include a different material than the at least one inner dielectric layer 220. The cover dielectric layer 240 may include a different material than the at least one inner dielectric layer 220 and the outer dielectric layer (e.g., 230, 430). The cover dielectric layer 240 and the outer dielectric layer (e.g., 230, 430), may each include a different material than the at least one inner dielectric layer 220. The cover dielectric layer 240 and the outer dielectric layer (e.g., 230, 430) may include the same material.

Having described various packages with routing interconnects, processes for fabricating a substrate with routing interconnects will now be described below.

Exemplary Sequence for Fabricating a Substrate Comprising Routing Interconnects

In some implementations, fabricating a substrate includes several processes. FIG. 5 (which includes FIGS. 5A-5F) illustrates an exemplary sequence for providing or fabricating a substrate. In some implementations, the sequence of FIGS. 5A-5F may be used to provide or fabricate the substrate 202 of FIG. 2. However, the process of FIGS. 5A-5F may be used to fabricate any of the substrates described in the disclosure.

It should be noted that the sequence of FIGS. 5A-5F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 5A:
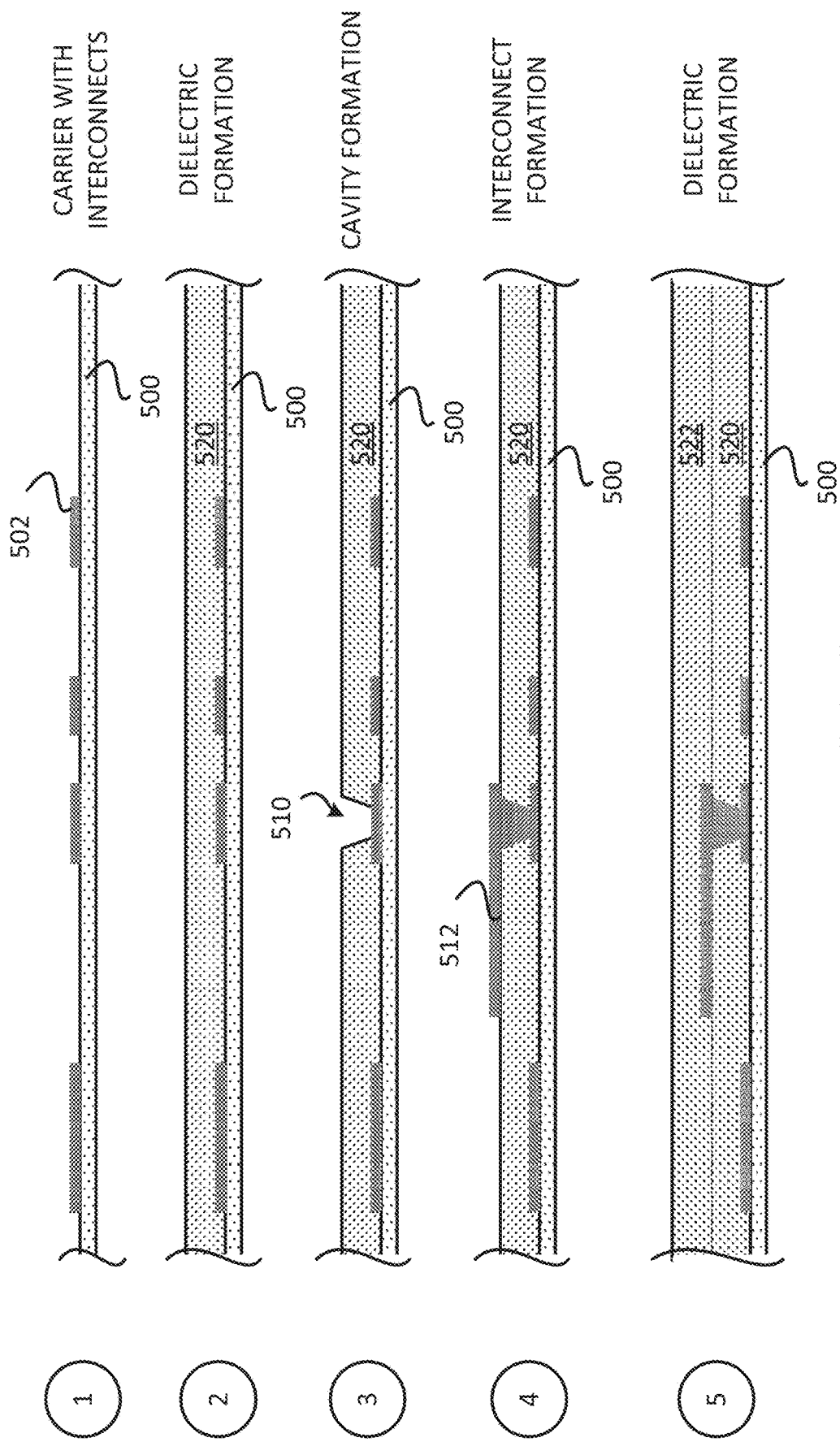
FIG. 5 (comprising FIGS. 5A-5F) illustrates an exemplary sequence for fabricating a substrate that includes interconnects located over a solder resist layer.

Stage 1, as shown in FIG. 5A, illustrates a state after a carrier 500 is provided and a metal layer is formed over the carrier 500. The metal layer may be patterned to form interconnects 502. A plating process and etching process may be used to form the metal layer and interconnects.

Stage 2 illustrates a state after a dielectric layer 520 is formed over the carrier 500 and the interconnects 502. The dielectric layer 520 may include polyimide. However, different implementations may use different materials for the dielectric layer. The dielectric layer 520 may be an inner dielectric layer.

Stage 3 illustrates a state after at least one cavity 510 is formed in the dielectric layer 520. The at least one cavity 510 may be formed using an etching process (e.g., photo etching process) or laser process.

Stage 4 illustrates a state after interconnects 512 are formed in and over the dielectric layer 520. For example, a via, pad and/or traces may be formed. A plating process may be used to form the interconnects. The interconnects 512 may be part of the plurality of interconnects 222.

Stage 5 illustrates a state after another dielectric layer 522 is formed over the dielectric layer 520. The dielectric layer 522 may be the same material as the dielectric layer 520. However, different implementations may use different materials for the dielectric layer. The dielectric layer 522 may be an inner dielectric layer.

Figure 5B:
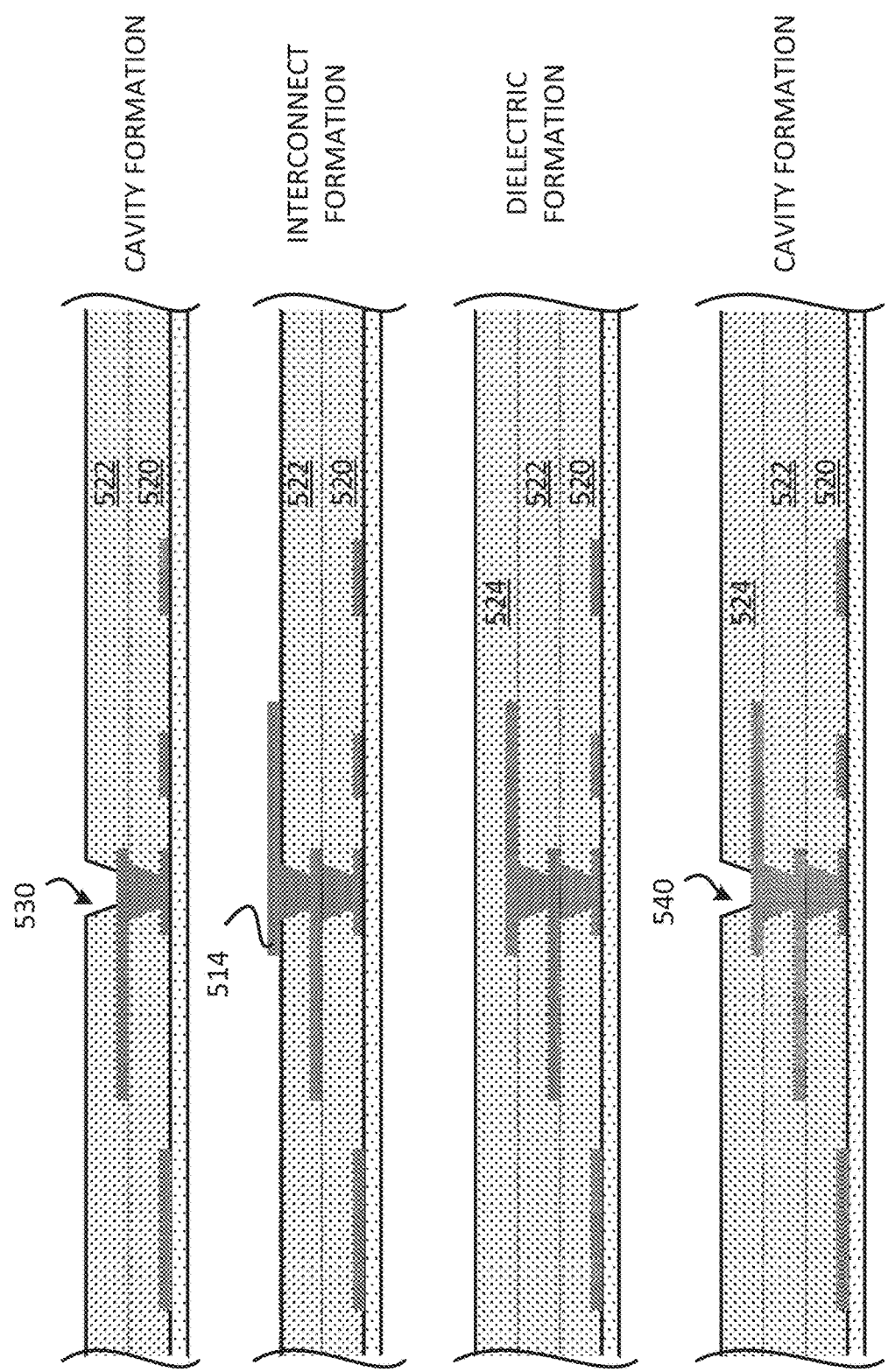

Stage 6, as shown in FIG. 5B, illustrates a state after at least one cavity 530 is formed in the dielectric layer 522. An etching process or laser process may be used to form the at least one cavity 530.

Stage 7 illustrates a state after interconnects 514 are formed in and over the dielectric layer 522. For example, via, pad and/or trace may be formed. A plating process may be used to form the interconnects. The interconnects 514 may be part of the plurality of interconnects 222.

Stage 8 illustrates a state after another dielectric layer 524 is formed over the dielectric layer 522. The dielectric layer 524 may be the same material as the dielectric layer 520. However, different implementations may use different materials for the dielectric layer. The dielectric layer 524 may be an inner dielectric layer.

Stage 9 illustrates a state after at least one cavity 540 is formed in the dielectric layer 524. An etching process or laser process may be used to form the at least one cavity 540.

Figure 5C:
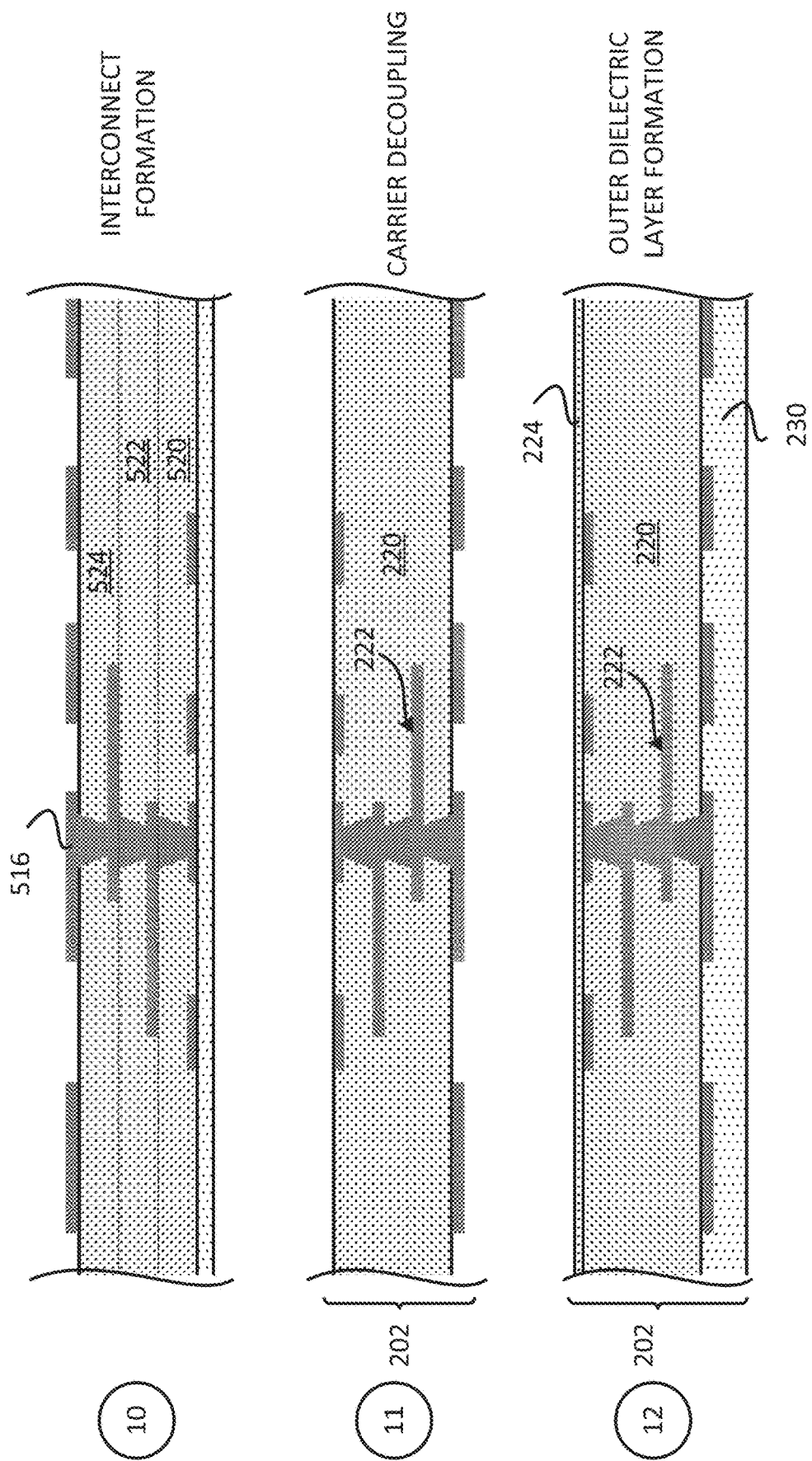

Stage 10, as shown in FIG. 5C, illustrates a state after interconnects 516 are formed in and over the dielectric layer 524. For example, via, pad and/or trace may be formed. A plating process may be used to form the interconnects.

Some or all of the interconnects 502, 512, 514 and/or 516 may define the plurality of interconnects 222 of the substrate 202. The dielectric layers 520, 522, 524 may be represented by the at least one inner dielectric layer 220.

Stage 11 illustrates a state after the carrier 500 is decoupled (e.g., removed, grinded out) from the at least one inner dielectric layer 220, leaving the substrate 202.

Stage 12 illustrates a state after the solder resist layer 224 and the outer dielectric layer 230 are formed over the substrate 202. A deposition process may be used to dispose the solder resist layer 224 and the outer dielectric layer 230 over the substrate 202. For example, the solder resist layer 224 may be disposed over (e.g., above) a first surface (e.g., top surface) of the at least one inner dielectric layer 220, and the outer dielectric layer 230 may be disposed over (e.g., below) a second surface (e.g., bottom surface) of the at least one inner dielectric layer 220. A top surface and a bottom surface may be defined arbitrarily. Different implementations may define a top or a bottom differently.

Figure 5D:
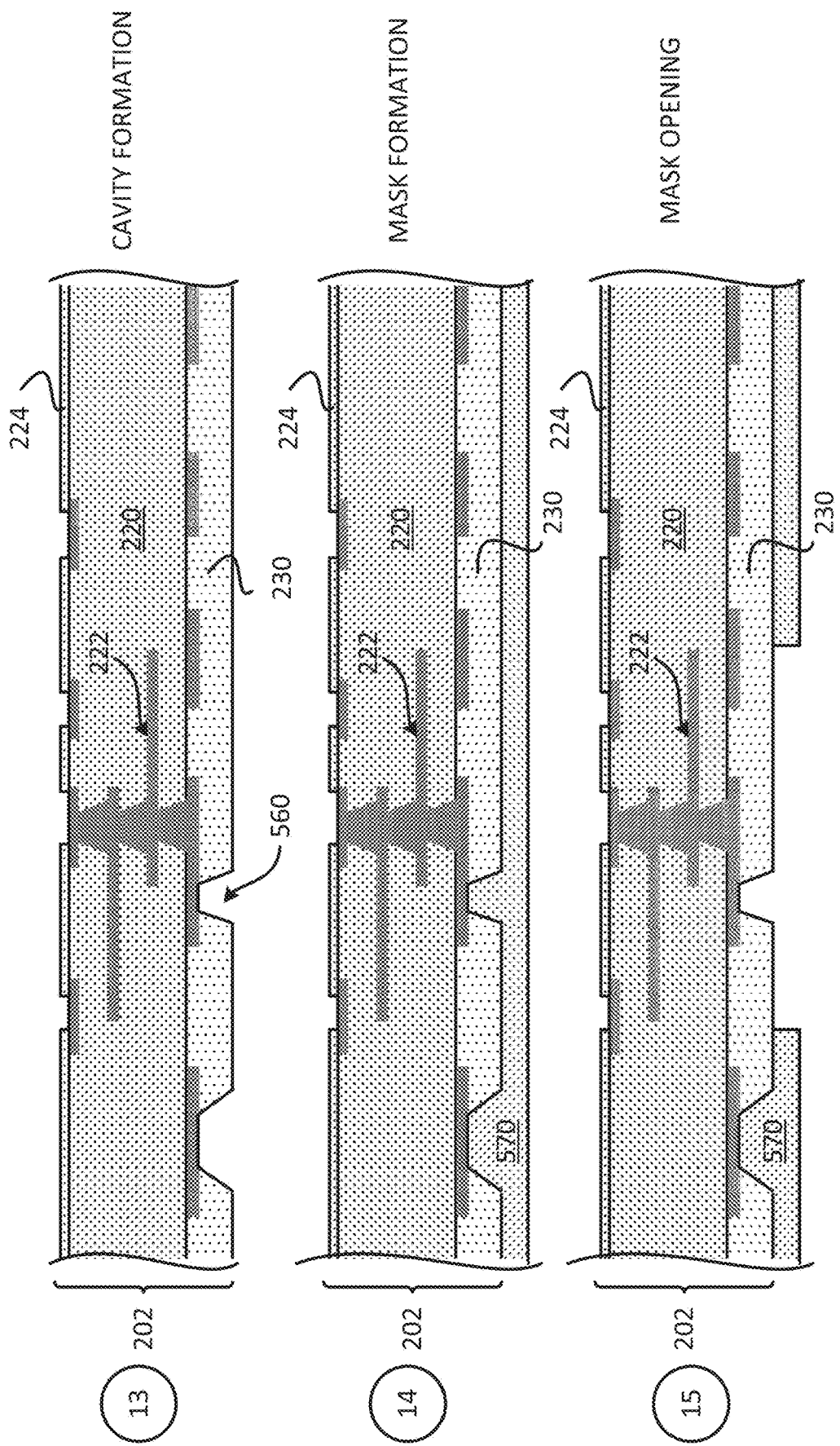

Stage 13, as shown in FIG. 5D, illustrates a state after cavities 560 are formed in the outer dielectric layer 230. A laser process and/or an etching process may be used to form the cavities 560.

Stage 14 illustrates a state after a mask 570 is formed over the outer dielectric layer 230.

Stage 15 illustrates a state after portions of the mask 570 are opened, exposing portions of the outer dielectric layer 230 and some of the interconnects from the plurality of interconnects 222. An etching process may be used to open portions of the mask 570.

Figure 5E:
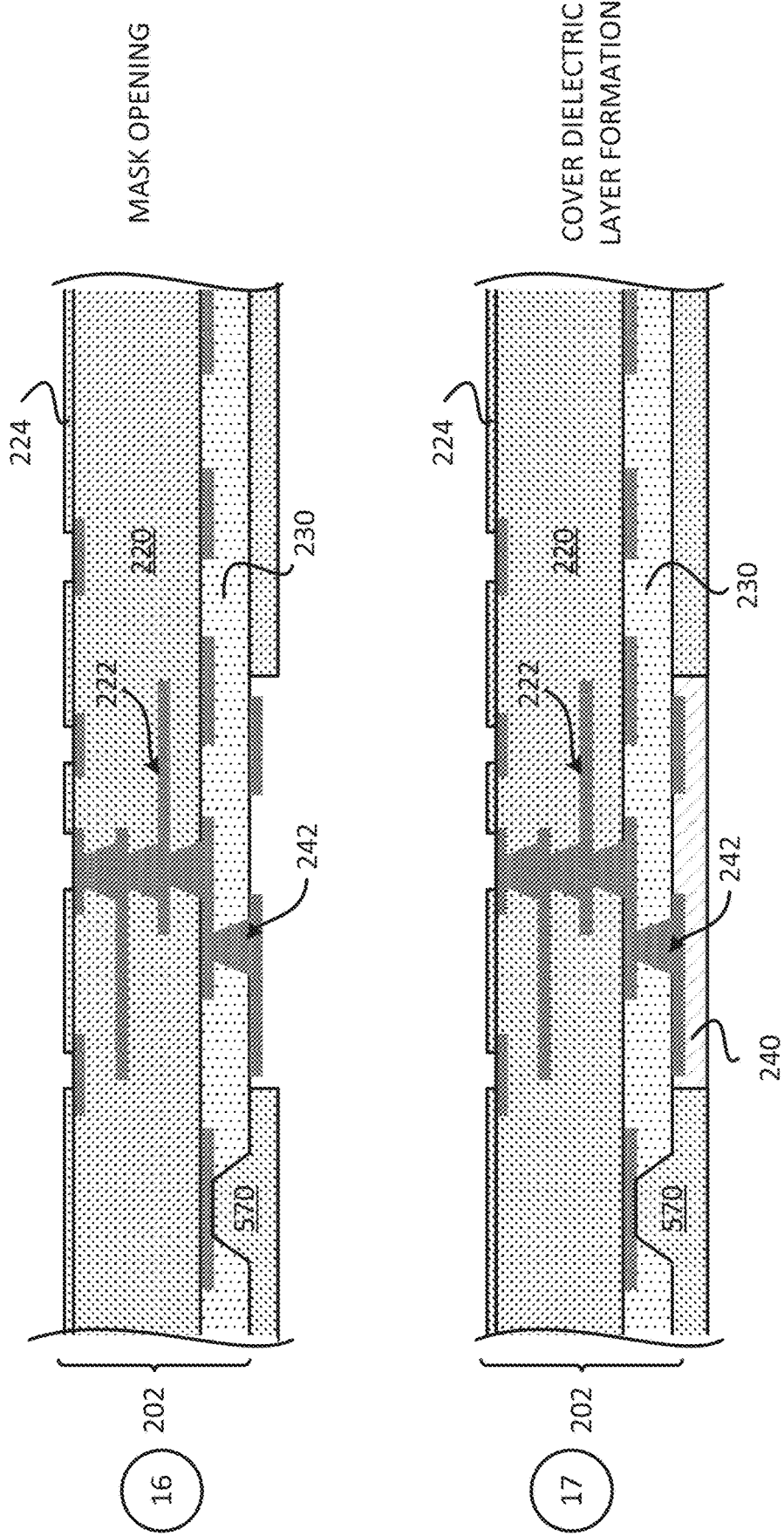

Stage 16, as shown in FIG. 5E, illustrates a state after at least one routing interconnect 242 is formed in and over the outer dielectric layer 230. For example, a routing via, a routing pad and/or a routing trace may be formed. A plating process may be used to form the routing interconnects.

Stage 17 illustrates a state after the cover dielectric layer 240 is formed over the at least one routing interconnect 242 and the outer dielectric layer 230. A deposition process may be used to dispose the cover dielectric layer 240 over the at least one routing interconnect 242 and the outer dielectric layer 230.

Stage 18, as shown in FIG. 5F, illustrates a state after the mask 570 is removed. An etching process may be used to remove or couple the mask 570.

Stage 19 illustrates a state after a solder interconnect (from the plurality of solder interconnects 280) is coupled to the plurality of interconnects 222. The solder interconnect 280 may be coupled to the pad 222a (which is part of the plurality of interconnects 222). The pad 222a may be located on a bottom metal layer of the substrate 202. Stage 19 may illustrate the substrate 202 that includes at least one routing interconnect 242 located between solder interconnects 280, as described in FIG. 2.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence for Fabricating a Substrate Comprising Routing Interconnects

Figure 6A:
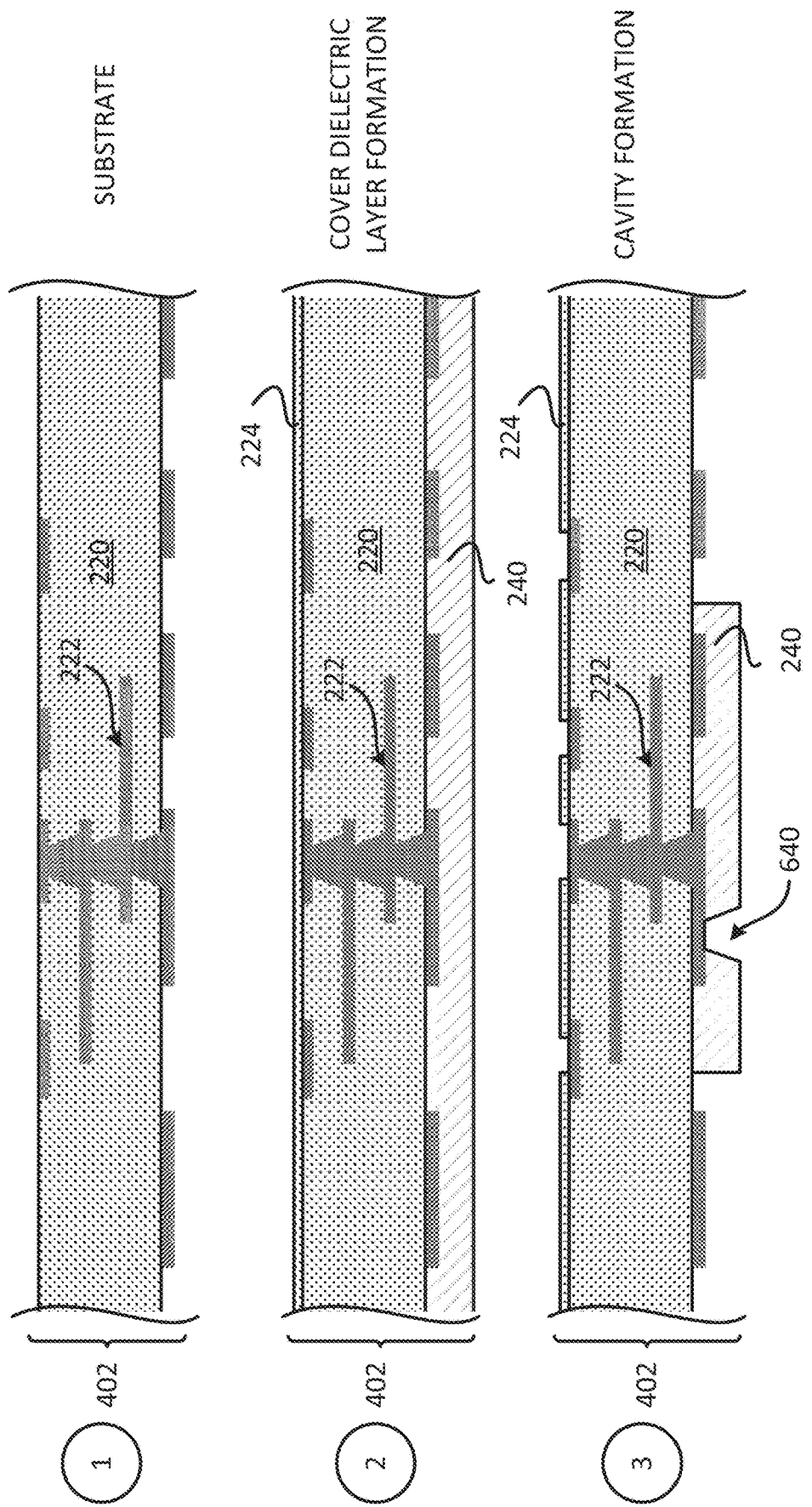
FIG. 6 (comprising FIGS. 6A-6B) illustrates an exemplary sequence for fabricating a substrate that includes interconnects located over an outer dielectric layer.
Figure 6B:
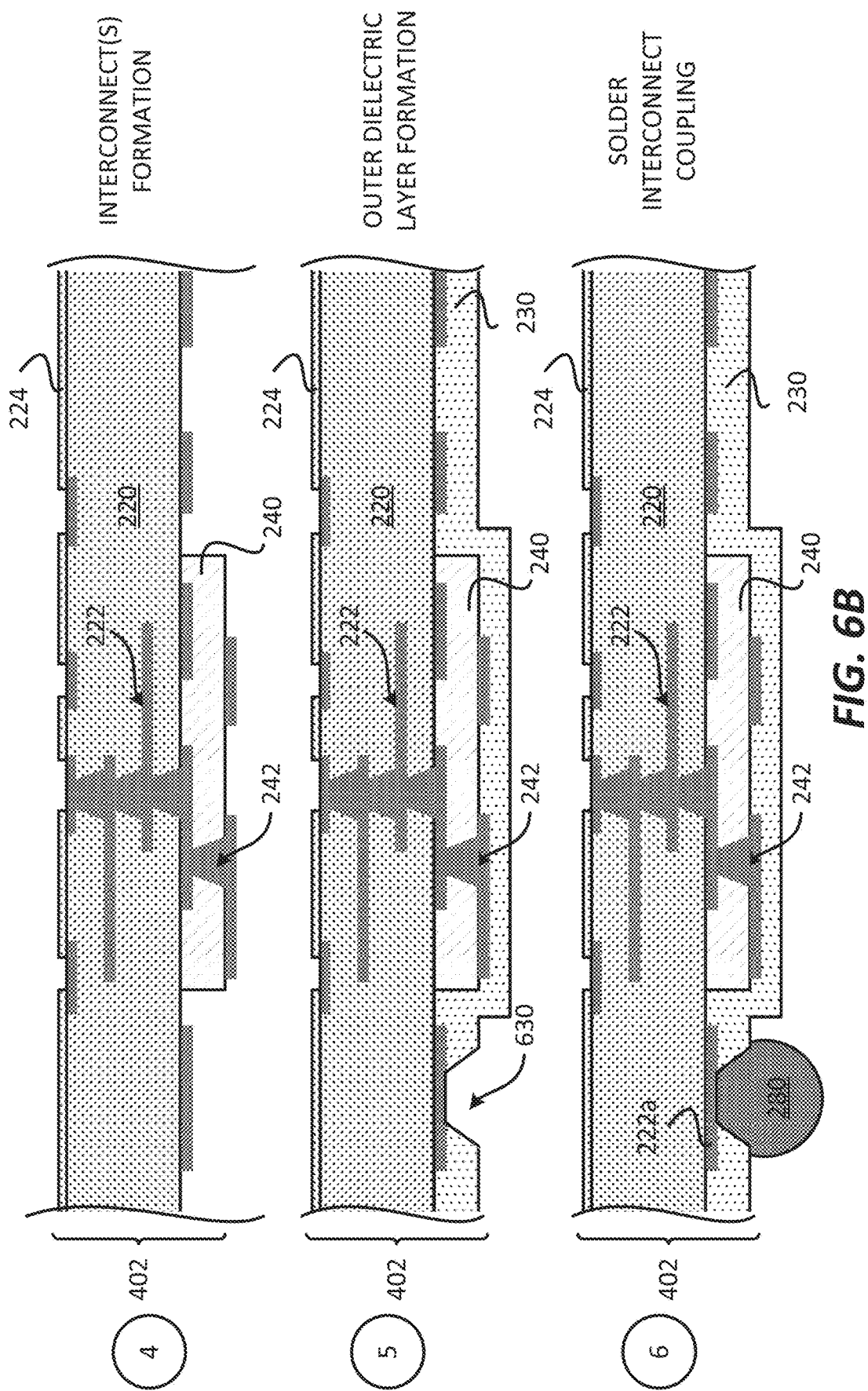

In some implementations, fabricating a substrate includes several processes. FIG. 6 (which includes FIGS. 6A-6B) illustrates an exemplary sequence for providing or fabricating a substrate. In some implementations, the sequence of FIGS. 6A-6B may be used to provide or fabricate the substrate 402 of FIG. 4. However, the process of FIGS. 6A-6B may be used to fabricate any of the substrates described in the disclosure.

It should be noted that the sequence of FIGS. 6A-6B may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 6A, illustrates a state after a substrate 402 that includes the at least one inner dielectric layer 220 and the plurality of interconnects 222, is provided. The substrate 402 of Stage 1 of FIG. 6A may be similar to the substrate 202 of Stage 11 of FIG. 5C. In some implementations, the substrate 402 of Stage 1 of FIG. 6A may be fabricated as shown and described in Stages 1-11 of FIGS. 5A-5C.

Stage 2 illustrates a state after the solder resist layer 224 and the cover dielectric layer 240 are formed over the substrate 402. A deposition process may be used to dispose the solder resist layer 224 and the cover dielectric layer 240 over the substrate 402.

Stage 3 illustrates a state after portions of the cover dielectric layer 240 are removed and cavities 640 are formed in the cover dielectric layer 240. A laser process and/or an etching process may be used to form the cavities 640 and/or remove portions of the cover dielectric layer 240.

Stage 4, as shown in FIG. 6B, illustrates a state after at least one routing interconnect 242 is formed in and over the cover dielectric layer 240. For example, a routing via, a routing pad and/or a routing trace may be formed. A plating process may be used to form the routing interconnects.

Stage 5 illustrates a state after the outer dielectric layer 230 is formed over the at least one routing interconnect 242 and the cover dielectric layer 240. A deposition process may be used to dispose the outer dielectric layer 230 over the at least one routing interconnect 242 and the cover dielectric layer 240. A laser process and/or an etching process may be used to form the cavity 630 in the outer dielectric layer 230.

Stage 6 illustrates a state after a solder interconnect (from the plurality of solder interconnects 280) is coupled to the plurality of interconnects 222. The solder interconnect 280 may be coupled to the pad 222a (which is part of the plurality of interconnects 222). The pad 222a may be located on a bottom metal layer of the substrate 402. Stage 6 may illustrate the substrate 402 that includes at least one routing interconnect 242 located between solder interconnects 280, as described in FIG. 4.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 7:
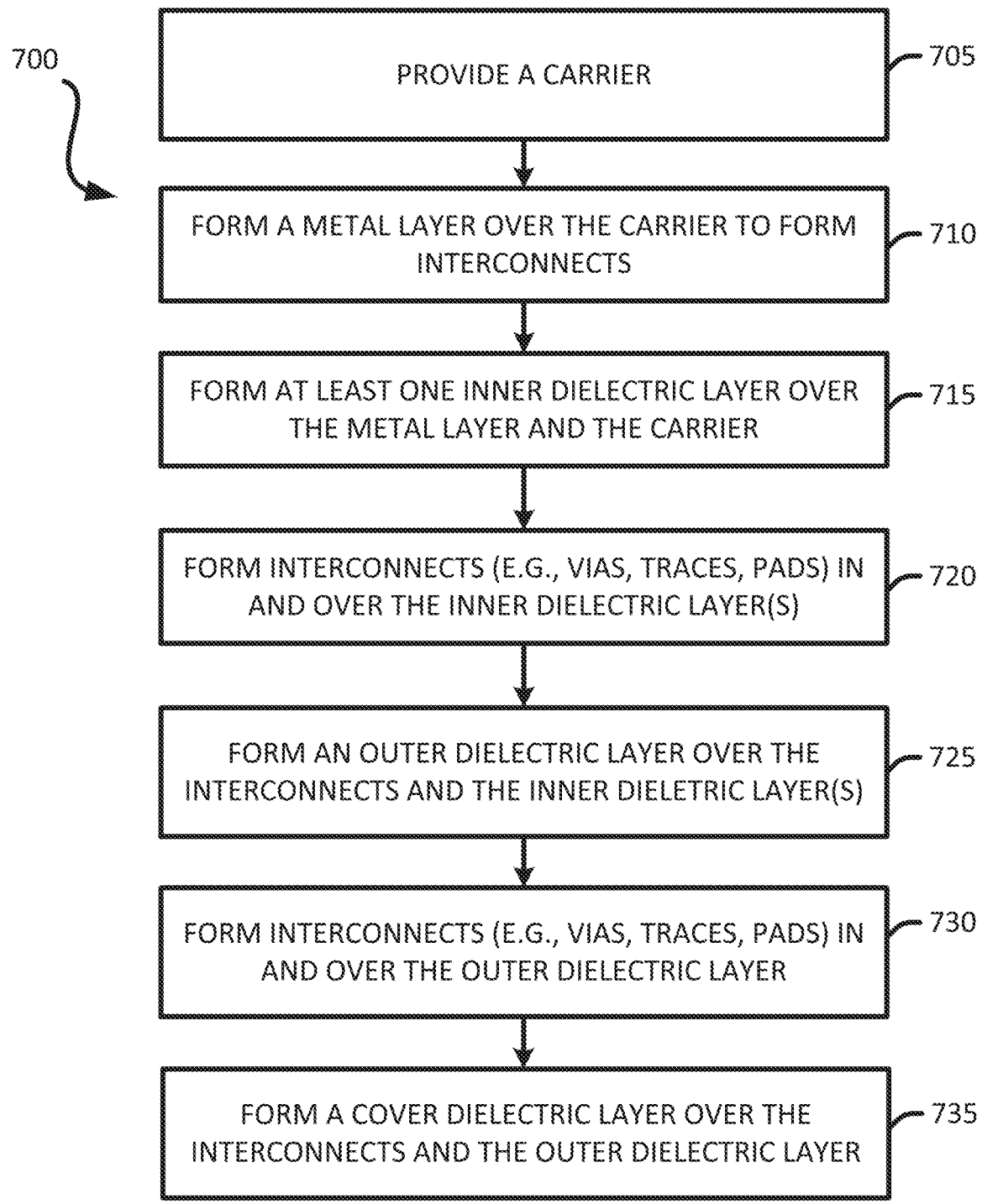
FIG. 7 illustrates an exemplary flow diagram of a method for fabricating substrate that includes interconnects located over a solder resist layer.

In some implementations, fabricating a substrate includes several processes. FIG. 7 illustrates an exemplary flow diagram of a method 700 for providing or fabricating a substrate. In some implementations, the method 700 of FIG. 7 may be used to provide or fabricate the substrate of FIG. 2. For example, the method of FIG. 7 may be used to fabricate the substrate 202 and/or the substrate 402.

It should be noted that the method of FIG. 7 may combine one or more processes in order to simplify and/or clarify the method for providing or fabricating a substrate. In some implementations, the order of the processes may be changed or modified.

The method provides (at 705) a carrier 500. Different implementations may use different materials for the carrier. The carrier may include a substrate, glass, quartz and/or carrier tape. Stage 1 of FIG. 5A illustrates a state after a carrier is provided.

The method forms (at 710) a metal layer over the carrier 500. The metal layer may be patterned to form interconnects. A plating process may be used to form the metal layer and interconnects. Stage 1 of FIG. 5A illustrates a state after a metal layer and interconnects 502 are formed.

The method forms (at 715) at least one inner dielectric layer (e.g., dielectric layer 520) over the carrier 500 and the interconnects 502. The dielectric layer 520 may include polyimide. Forming the dielectric layer may also include forming a plurality of cavities (e.g., 510) in the dielectric layer 520. A deposition process may be used to form the at least one inner dielectric layer. The plurality of cavities may be formed using an etching process (e.g., photo etching) or laser process. Stages 2-3 of FIG. 5A illustrate forming a dielectric layer and cavities in the dielectric layer.

The method forms (at 720) interconnects in and over the inner dielectric layer. For example, the interconnects 512 may be formed in and over the dielectric layer 520. A plating process may be used to form the interconnects. Forming interconnects may include providing a patterned metal layer over and/or in the dielectric layer. Stage 4 of FIG. 5A illustrates an example of forming interconnects in and over a dielectric layer.

In some implementations, several inner dielectric layers (e.g., 522, 524) and several interconnects may be formed in and over the inner dielectric layers. Stages 2-10 of FIGS. 5A-5C illustrate examples of forming at least one inner dielectric layer and a plurality of interconnects in and over the inner dielectric layer(s).

The method forms (at 725) an outer dielectric layer 230 over the at least one inner dielectric layer 220 and the plurality of interconnects 222. The outer dielectric layer 230 may include a solder resist layer or a photo imageable dielectric (PID). A deposition process may be used to form the outer dielectric layer 230. Forming the outer dielectric layer may also include forming a plurality of cavities (e.g., 530) in the outer dielectric layer 230. The plurality of cavities may be formed using an etching process or laser process. Stages 12-13 of FIGS. 5C-15D illustrate forming an outer dielectric layer and cavities in the outer dielectric layer.

The method forms (at 730) routing interconnects in and/or over the outer dielectric layer. For example, the at least one routing interconnect 242 may be formed. A plating process may be used to form the routing interconnects. Forming routing interconnects may include providing a patterned metal layer over an in the outer dielectric layer 230. Stages 14-16 of FIGS. 5D-5E may illustrate an example of forming interconnects in and over an outer dielectric layer.

The method forms (at 735) a cover dielectric layer (e.g., 240) over the outer dielectric layer 230 and the at least one routing interconnect 242. The cover dielectric layer 240 may include a solder resist layer or a photo imageable dielectric (PID). A deposition process may be used to form the cover dielectric layer 240. Stages 17-19 of FIGS. 5E-5F may illustrate an example of forming a cover dielectric layer.

As mentioned above, the method may form the dielectric layers in different order. For example, in some implementations, at least one cover dielectric layer may be formed before at least one outer dielectric layer is formed. Such an example is described in at least FIGS. 6A-6B above. Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 8A:
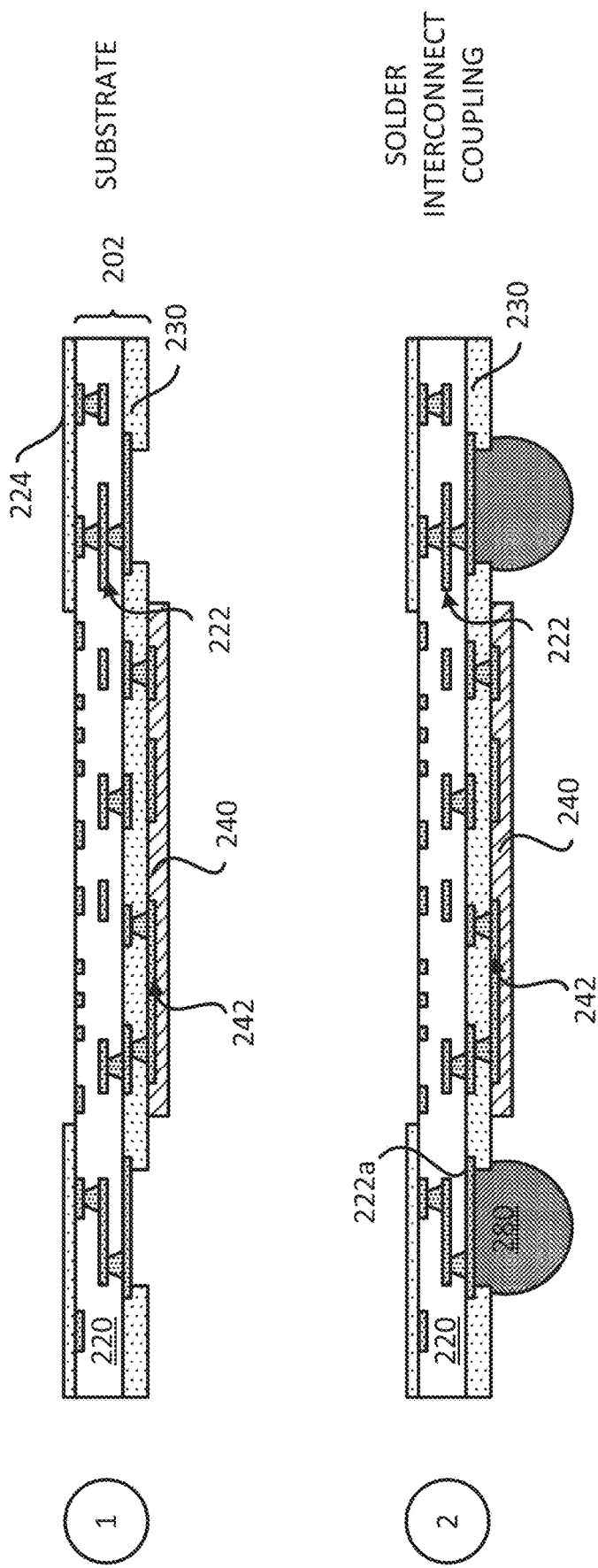
FIG. 8 (comprising FIGS. 8A-8B) illustrates an exemplary sequence for fabricating a package that includes a substrate with interconnects located over a solder resist layer.
Figure 8B:
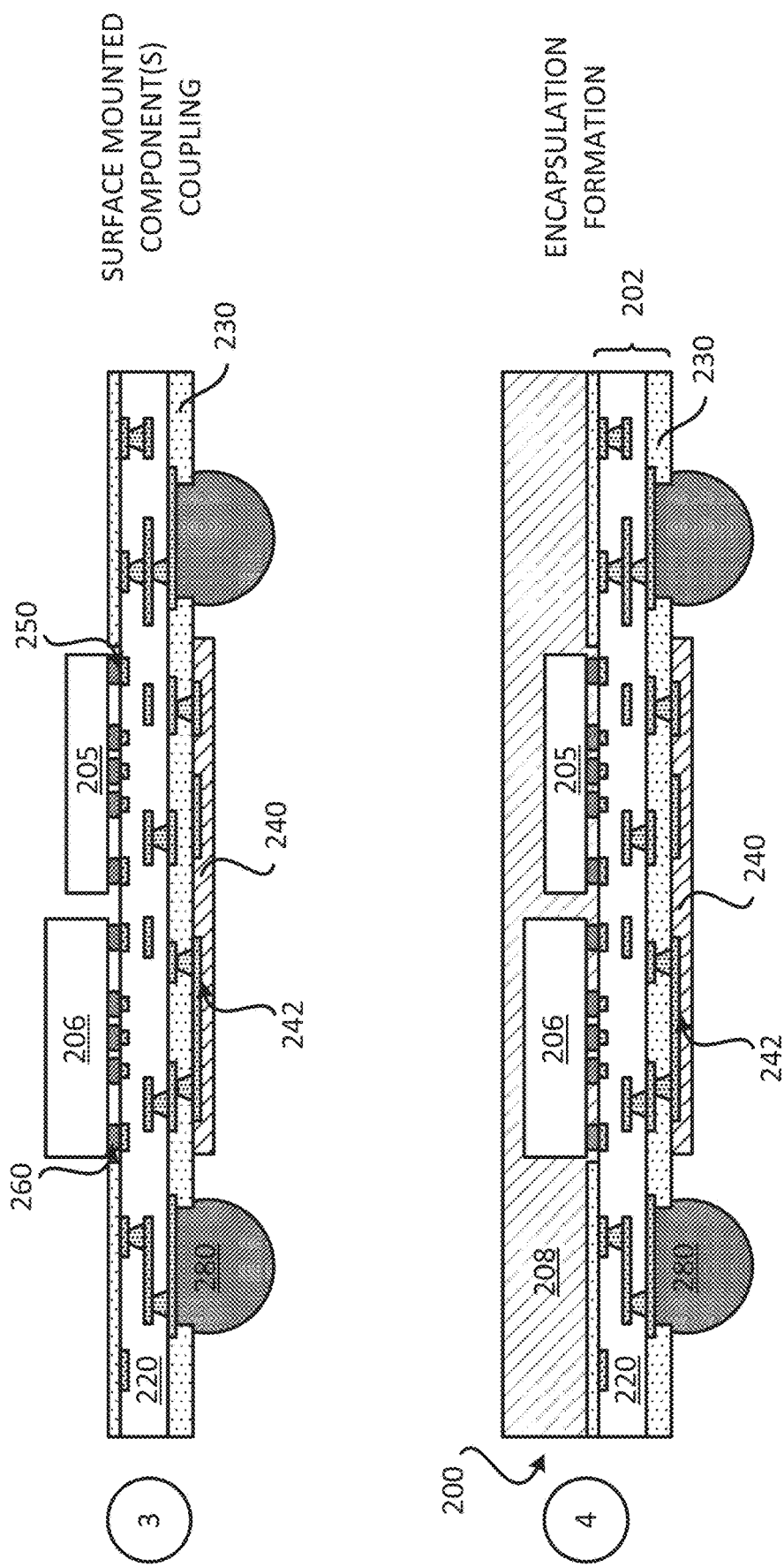

Exemplary Sequence for Fabricating a Package that Includes a Substrate with Interconnects Located Over an Outer Dielectric Layer FIG. 8 (which includes FIGS. 8A-8B) illustrates an exemplary sequence for providing or fabricating a package that includes a substrate. In some implementations, the sequence of FIGS. 8A-8B may be used to provide or fabricate the package 200 that includes the substrate 202 of FIG. 2, or any of the packages described in the disclosure.

It should be noted that the sequence of FIGS. 8A-8B may combine one or more stages in order to simplify and/or clarify the sequence for providing or fabricating the package. In some implementations, the order of the processes may be changed or modified. In some implementations, one or more of processes may be replaced or substituted without departing from the spirit of the disclosure. The sequence of FIGS. 8A-8B may be used to fabricate one package or several packages at a time (as part of a wafer).

Stage 1, as shown in FIG. 8A, illustrates a state after the substrate 202 is provided. The substrate 202 may be provided by a supplier or fabricated. A process similar to the process shown in FIGS. 5A-5F may be used to fabricate the substrate 202. However, different implementations may use different processes to fabricate the substrate 202. Examples of processes that may be used to fabricate the substrate 202 include a semi-additive process (SAP) and a modified semi-additive process (mSAP).

The substrate 202 includes a first surface (e.g., top surface) and a second surface (e.g., bottom surface). The substrate 202 includes at least one inner dielectric layer 220, a plurality of interconnects 222, a solder resist layer 224, an outer dielectric layer 230, a cover dielectric layer 240, and at least one routing interconnect 242. The plurality of interconnects 222 is located at least in and over the at least one inner dielectric layer 220. The plurality of interconnects 222 includes at least one pad 222*a* located on a bottom metal layer of the substrate 202. The pad 222*a* is configured to be coupled to a solder interconnect from the plurality of solder interconnects 280. The outer dielectric layer 230 is located over the at least one inner dielectric layer 220. The at least one routing interconnect 242 is coupled to the plurality of interconnects 222. The at least one routing interconnect 242 is located over the outer dielectric layer 230. The at least one routing interconnect 242 is located over (or under, depending on how top and bottom are arbitrarily defined) the bottom metal layer of substrate 202. The cover dielectric layer 240 is located over the outer dielectric layer 230 and the at least one routing interconnect 242.

Stage 2 illustrates a state after the plurality of solder interconnects 280 is coupled to the substrate 202. The solder interconnect 280 may be coupled to a bottom metal layer of the substrate 202. For example, the solder interconnect 280 may be coupled to the pad 222*a* (which is located on a bottom metal layer) of the substrate 202. A reflow process may be used to couple the solder interconnect 280 to the substrate 202.

Stage 3, as shown in FIG. 8B, illustrates a state after the first integrated device 205 is coupled to a first surface (e.g., top surface) of the substrate 202 through the plurality of interconnects 250. The plurality of interconnects 250 may be coupled to interconnects from the plurality of interconnects 222 of the substrate 202. Stage 3 also illustrates a state after the second integrated device 206 is coupled to the first surface (e.g., top surface) of the substrate 202 through the plurality of interconnects 260. The plurality of interconnects 260 may be coupled to interconnects from the plurality of interconnects 222 of the substrate 202. A reflow process may be used to couple the first integrated device 205 and/or the second integrated device 206 to the substrate 202.

Stage 4 illustrate a state after the encapsulation layer 208 is formed over the first surface of the substrate 202 such that the encapsulation layer 208 encapsulates the first integrated device 205 and the second integrated device 206. The process of forming and/or disposing the encapsulation layer 208 may include using a compression and transfer molding process, a sheet molding process, or a liquid molding process. Stage 4 may illustrate the package 200 that includes the substrate 202, the first integrated device 205, the second integrated device 206 and the encapsulation layer 208.

The packages (e.g., 200, 400) described in the disclosure may be fabricated one at a time or may be fabricated together as part of one or more wafers and then singulated into individual packages.

Exemplary Flow Diagram of a Method for Fabricating a Package that Includes a Substrate with Interconnects Located Over an Outer Dielectric Layer In some implementations, fabricating a package that includes a substrate includes several processes. FIG. 9 illustrates an exemplary flow diagram of a method 900 for providing or fabricating a package that includes a substrate. In some implementations, the method 900 of FIG. 9 may be used to provide or fabricate the package 200 of FIG. 2 described in the disclosure. However, the method 900 may be used to provide or fabricate any of the packages described in the disclosure.

It should be noted that the method of FIG. 9 may combine one or more processes in order to simplify and/or clarify the method for providing or fabricating a package that a substrate. In some implementations, the order of the processes may be changed or modified.

The method provides (at 905) a substrate (e.g., 202, 402). The substrate 202 may be provided by a supplier or fabricated. The substrate 202 includes a first surface (e.g., top surface) and a second surface (e.g., bottom surface). The substrate 202 may include at least one inner dielectric layer 220, a plurality of interconnects 222, a solder resist layer 224, an outer dielectric layer 230, a cover dielectric layer 240, and at least one routing interconnect 242. The plurality of interconnects 222 is located at least in and over the at least one inner dielectric layer 220. The plurality of interconnects 222 includes at least one pad 222*a* located on a bottom metal layer of the substrate 202. The pad 222*a* is configured to be coupled to a solder interconnect from the plurality of solder interconnects 280. The outer dielectric layer 230 is located over the at least one inner dielectric layer 220. The at least one routing interconnect 242 is coupled to the plurality of interconnects 222. The at least one routing interconnect 242 is located over the outer dielectric layer 230. The at least one routing interconnect 242 is located below the bottom metal layer of substrate 202. The cover dielectric layer 240 is located over the outer dielectric layer 230 and the at least one routing interconnect 242.

Different implementations may provide different substrates. A process similar to the process shown in FIGS. 5A-5F may be used to fabricate the substrate 202. However, different implementations may use different processes to fabricate the substrate 202. Stage 1 of FIG. 8A illustrates and describes an example of providing a substrate.

The method couples (at 910) the plurality of solder interconnects (e.g., 280) to the substrate (e.g., 202). The solder interconnect 280 may be coupled to a bottom metal layer of the substrate 202. For example, the solder interconnect 280 may be coupled to the pad 222*a* (which is located on a bottom metal layer) of the substrate 202. A reflow process may be used to couple the solder interconnect 280 to the substrate 202. Stage 2 of FIG. 8A illustrates and describes an example of coupling solder interconnects to a substrate.

The method couples (at 915) components to the substrate (e.g., 202). For example, the method may couple the first integrated device 205 to a first surface (e.g., top surface) of the substrate 202 through the plurality of interconnects 250. The plurality of interconnects 250 may be coupled to interconnects from the plurality of interconnects 222 of the substrate 202. The method may couple the second integrated device 206 to a first surface (e.g., top surface) of the substrate 202 through the plurality of interconnects 260. The plurality of interconnects 260 may be coupled to interconnects from the plurality of interconnects 222 of the substrate 202. A reflow process may be used to couple the first integrated device 205 and/or the second integrated device 206 to the substrate 202. Stage 3 of FIG. 8B illustrates and describes an example of coupling components to a substrate.

The method forms (at 925) an encapsulation layer (e.g., 208) over the first surface of the substrate (e.g., 202). The encapsulation layer may be formed over the first surface of the substrate such that the encapsulation layer 208 encapsulates the first integrated device 205 and the second integrated device 206 (which are example of components). The process of forming and/or disposing the encapsulation layer 208 may include using a compression and transfer molding process, a sheet molding process, or a liquid molding process. Stage 4 of FIG. 8B, illustrates and describes an example of an encapsulation layer that is located over the substrate and encapsulates the integrated device.

Figure 10:
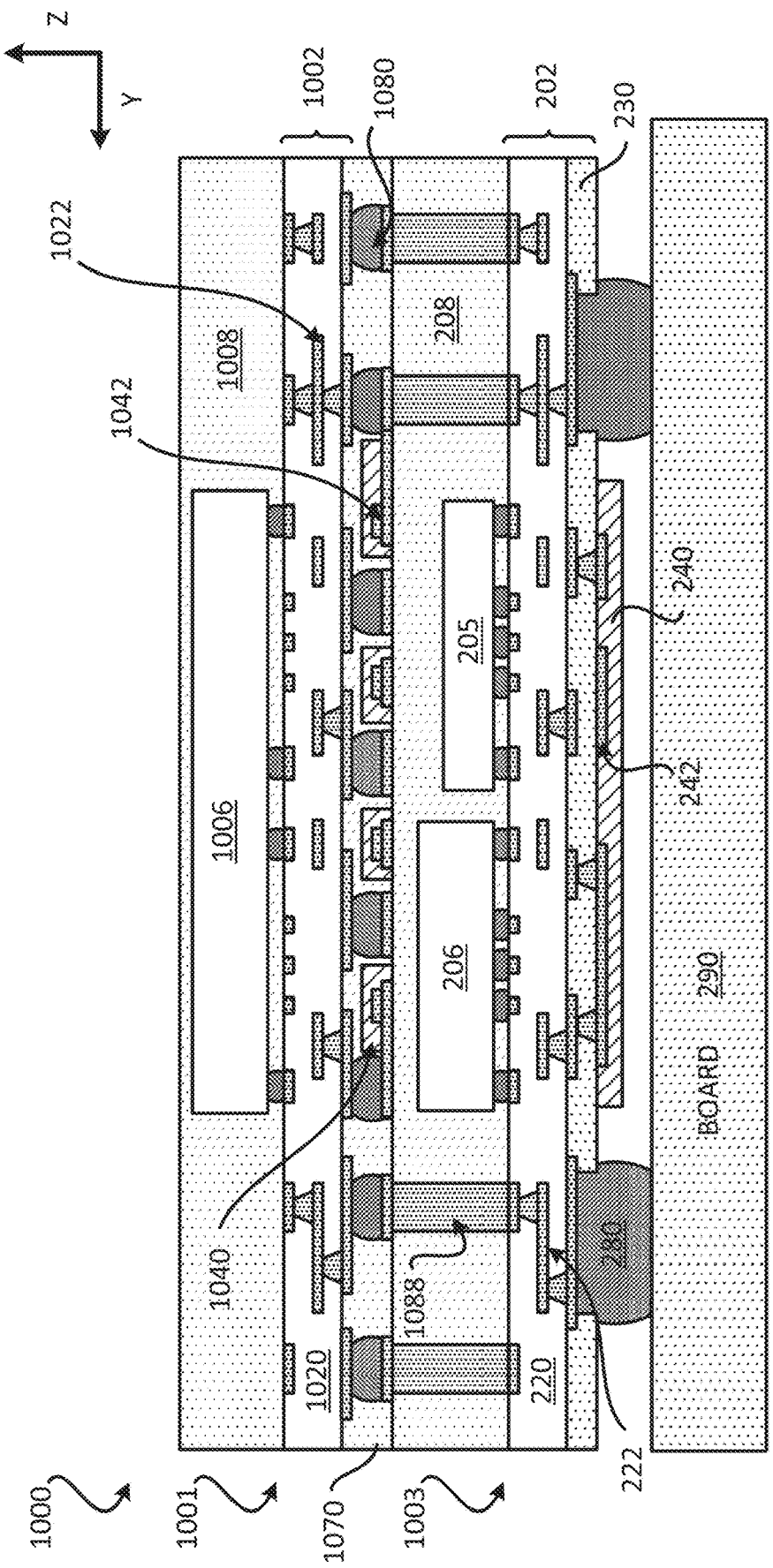
FIG. 10 illustrates a package on package (PoP) that includes a package comprising a substrate with interconnects located over a solder resist layer.

Exemplary Package on Package (PoP) Comprising a Package Having a Substrate with Interconnects Located Over an Outer Dielectric Layer FIG. 10 illustrates a profile view of a package on package (PoP) 1000 that includes a package 1001 and a package 1003 that includes interconnects located over an outer dielectric layer. The package 1001 is coupled to the package 1003 through the plurality of solder interconnects 1080. The package 1001 is located over the package 1003. The PoP 1000 is coupled to a board 290 (e.g., printed circuit board (PCB)) through a plurality of solder interconnects 280 of the package 1003. The package 1003 provides a package with a compact small factor while also having an improved routing interconnect design.

The package 1003 of FIG. 10 is similar to the package 200 of FIG. 2, and thus include similar components as the package 200. The package 1003 includes a plurality of vias 1088 that travel through the encapsulation layer 208. The plurality of vias 1088 may include through mold vias (TMVs). The plurality of vias 1088 is coupled to the plurality of interconnects 222. The package 1003 includes a plurality of upper routing interconnects 1042 that is located over the encapsulation layer 208. The plurality of upper routing interconnects 1042 may be coupled to the plurality of vias 1088. An upper cover dielectric layer 1040 is located over the plurality of upper routing interconnects 1042 and the encapsulation layer 208. The plurality of upper routing interconnects 1042 is located (e.g., laterally located) between the plurality of solder interconnects 1080. The plurality of upper routing interconnects 1042 may be means for upper routing interconnect. An encapsulation layer 1070 may be located between the package 1001 and the package 1003.

The package 1001 includes a substrate 1002, an integrated device 1006, and an encapsulation layer 1008. The substrate 1002 includes at least one dielectric layer 1020 and a plurality of interconnects 1022. The integrated device 1006 is coupled to the substrate 1002. The encapsulation layer 1008 is coupled to the substrate 1002 and encapsulates the integrated device 1006.

In some implementations, the package 1001 may be similar to the package 200, and thus the package 1001 may include an outer dielectric layer (e.g., 230) and/or a cover dielectric layer (e.g., 240).

As used in the disclosure, when a particular dielectric layer is located "over" another dielectric layer, the particular dielectric layer may be located above or below the another dielectric layer, depending on how a bottom (e.g., bottom layer) or top (e.g., top layer) is arbitrarily defined. A particular dielectric layer that is located "over" another dielectric layer (whether above or below) may mean that the particular dielectric layer is coupled to a surface of the another dielectric layer. For example, a surface of the particular dielectric layer may be in contact (e.g., touching) another surface of the another dielectric layer.

Figure 11A:
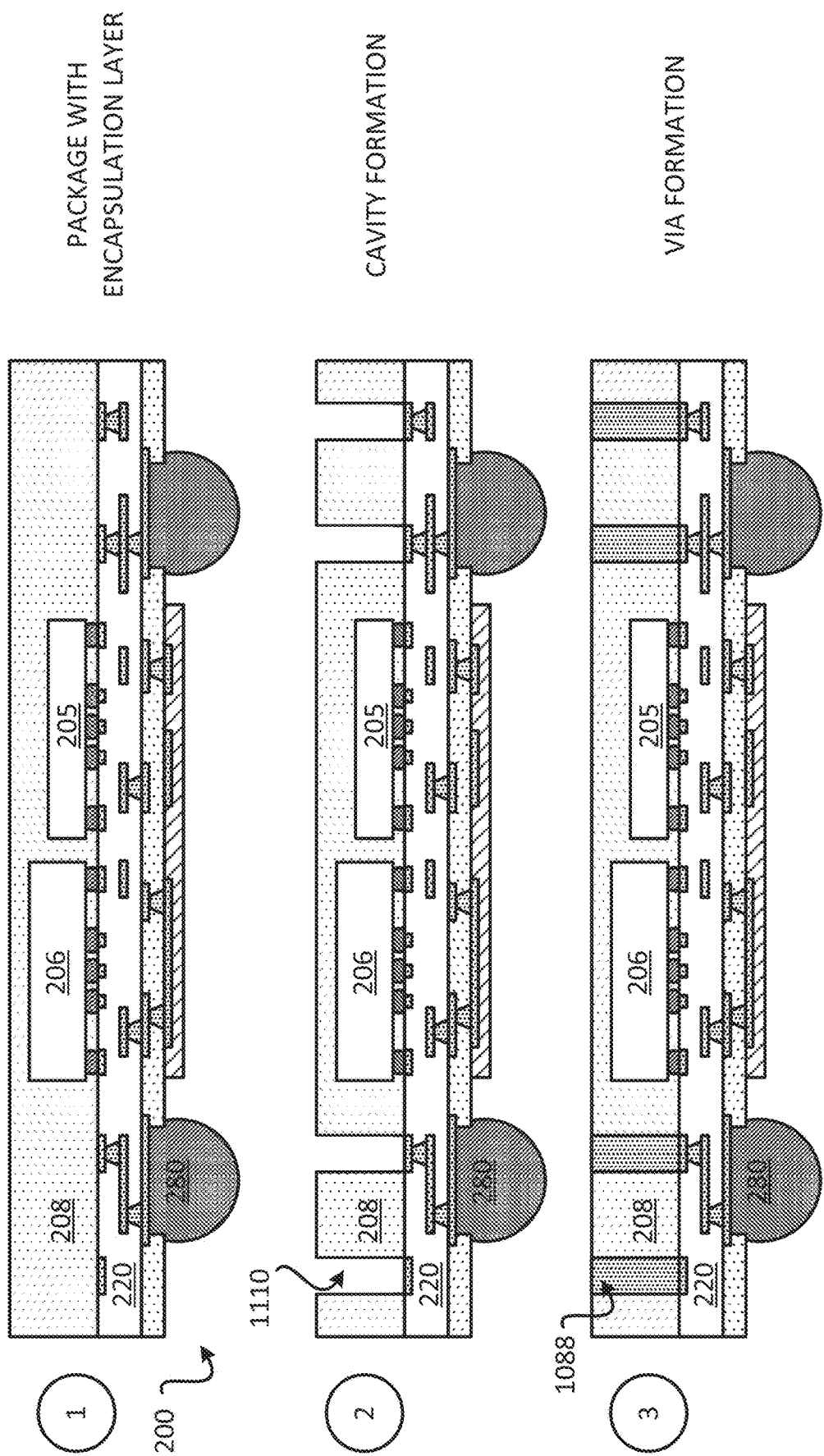
FIG. 11 (comprising FIGS. 11A-11C) illustrates an exemplary sequence for fabricating a package on package (PoP) that includes a package comprising a substrate with interconnects located over a solder resist layer.
Figure 11B:
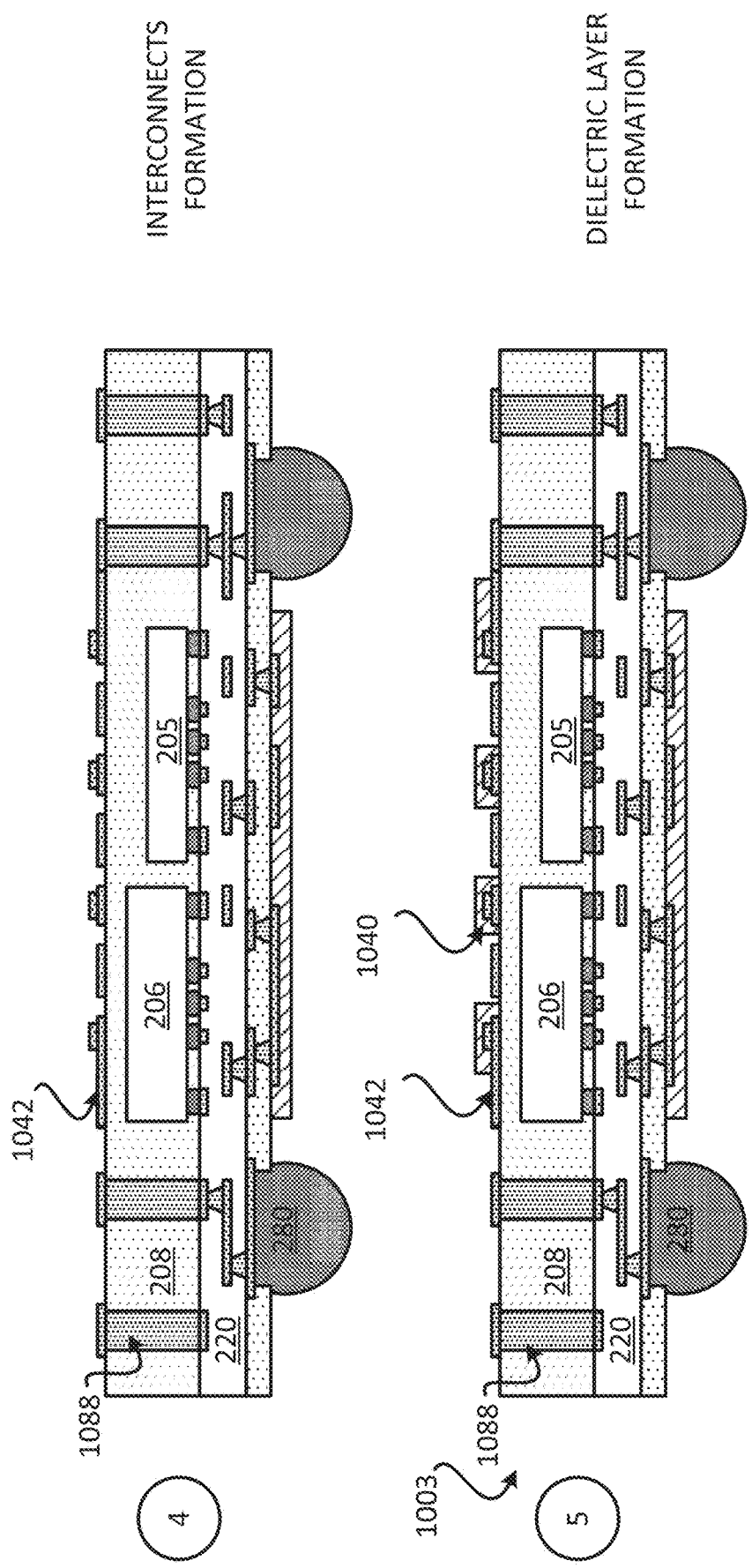
Figure 11C:
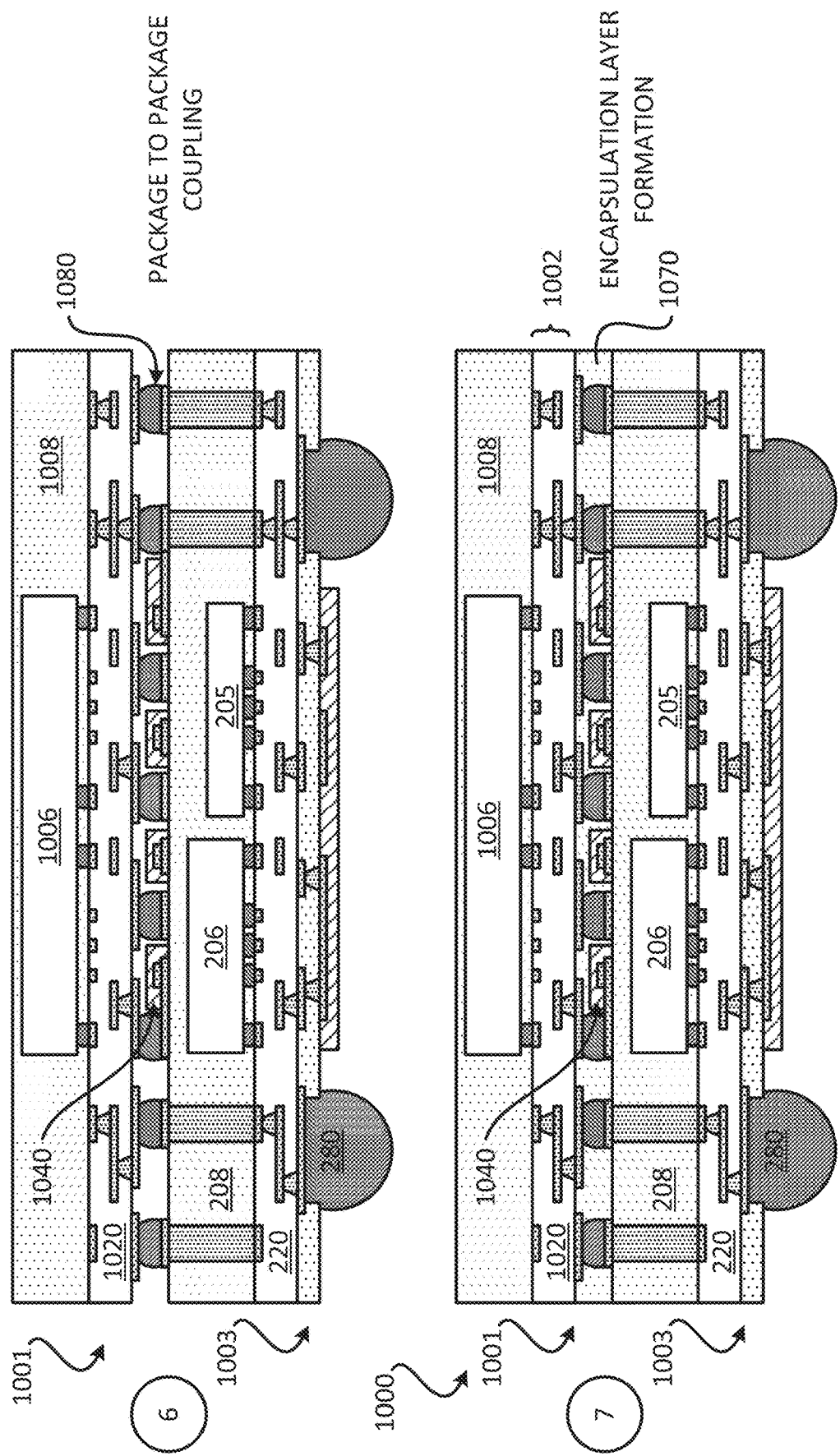

Exemplary Sequence for Fabricating a Package on Package (PoP) Comprising a Package that Includes a Substrate with Interconnects Located Over an Outer Dielectric Layer FIG. 11 (which includes FIGS. 11A-11C) illustrates an exemplary sequence for providing or fabricating a package on package (PoP). In some implementations, the sequence of FIGS. 11A-11C may be used to provide or fabricate the PoP 1000 of FIG. 10, or any of the PoPs described in the disclosure.

It should be noted that the sequence of FIGS. 11A-11C may combine one or more stages in order to simplify and/or clarify the sequence for providing or fabricating the PoP. In some implementations, the order of the processes may be changed or modified. In some implementations, one or more of processes may be replaced or substituted without departing from the spirit of the disclosure. The sequence of FIGS. 11A-11C may be used to fabricate one PoP or several PoP at a time (as part of a wafer).

Stage 1, as shown in FIG. 11A, illustrates a state after the package 200 is provided or fabricated. FIGS. 8A-8B illustrate an example of providing a package. The package 200 may include a substrate that includes at least one routing interconnect, an outer dielectric layer and a cover dielectric layer, as described in FIG. 2.

Stage 2 illustrates a state after cavities 1110 are formed in the encapsulation layer 208 of the package 200. A laser process and/or an etching process may be used to form the cavities 1110 in the encapsulation layer 208.

Stage 3 illustrates a state after vias 1088 are formed in the cavities 1110 of the encapsulation layer 208. A pasting process and/or plating process may be used to form the vias 1088. The vias 1088 may be coupled to the plurality of interconnects 222 of the substrate 202.

Stage 4, as shown in FIG. 11B, illustrates a state after a plurality of upper routing interconnects 1042 is formed over the encapsulation layer 208. The plurality of upper routing interconnects 1042 may be coupled to the vias 1088. A plating process may be used to form the plurality of upper routing interconnects 1042.

Stage 5 illustrates a state after an upper cover dielectric layer 1040 is formed over the plurality of upper routing interconnects 1042 and the encapsulation layer 208. A deposition process may be used to dispose the upper cover dielectric layer 1040 over the plurality of upper routing interconnects 1042 and the encapsulation layer 208. The upper cover dielectric layer 1040 may include a solder resist layer or a photo imageable dielectric (PID). The package 1003 may be fabricated from the package 200.

Stage 6, as shown in FIG. 11C, illustrates a state after the package 1001 is coupled to the package 1003 through the plurality of solder interconnects 1080. A reflow process may be used to couple the package 1001 to the package 1003. The package 1001 includes a substrate 1002, an integrated device 1006, and an encapsulation layer 1008. The substrate 1002 includes at least one dielectric layer 1020 and a plurality of interconnects 1022. The integrated device 1006 is coupled to the substrate 1002. The encapsulation layer 1008 is coupled to the substrate 1002 and encapsulates the integrated device 1006. The package 1001 may be fabricated using a similar process to fabricate the package 1003.

Stage 7 illustrates a state after an encapsulation layer 1070 is formed between the package 1001 and the package 1003. The process of forming and/or disposing the encapsulation layer 10070 may include using a compression and transfer molding process, a sheet molding process, or a liquid molding process to form the encapsulation layer 1070 between the encapsulation layer 208 and the substrate 1002. Stage 7 illustrates the PoP 1000 that includes the package 1001 and the package 1003.

Exemplary Electronic Devices

Figure 12:
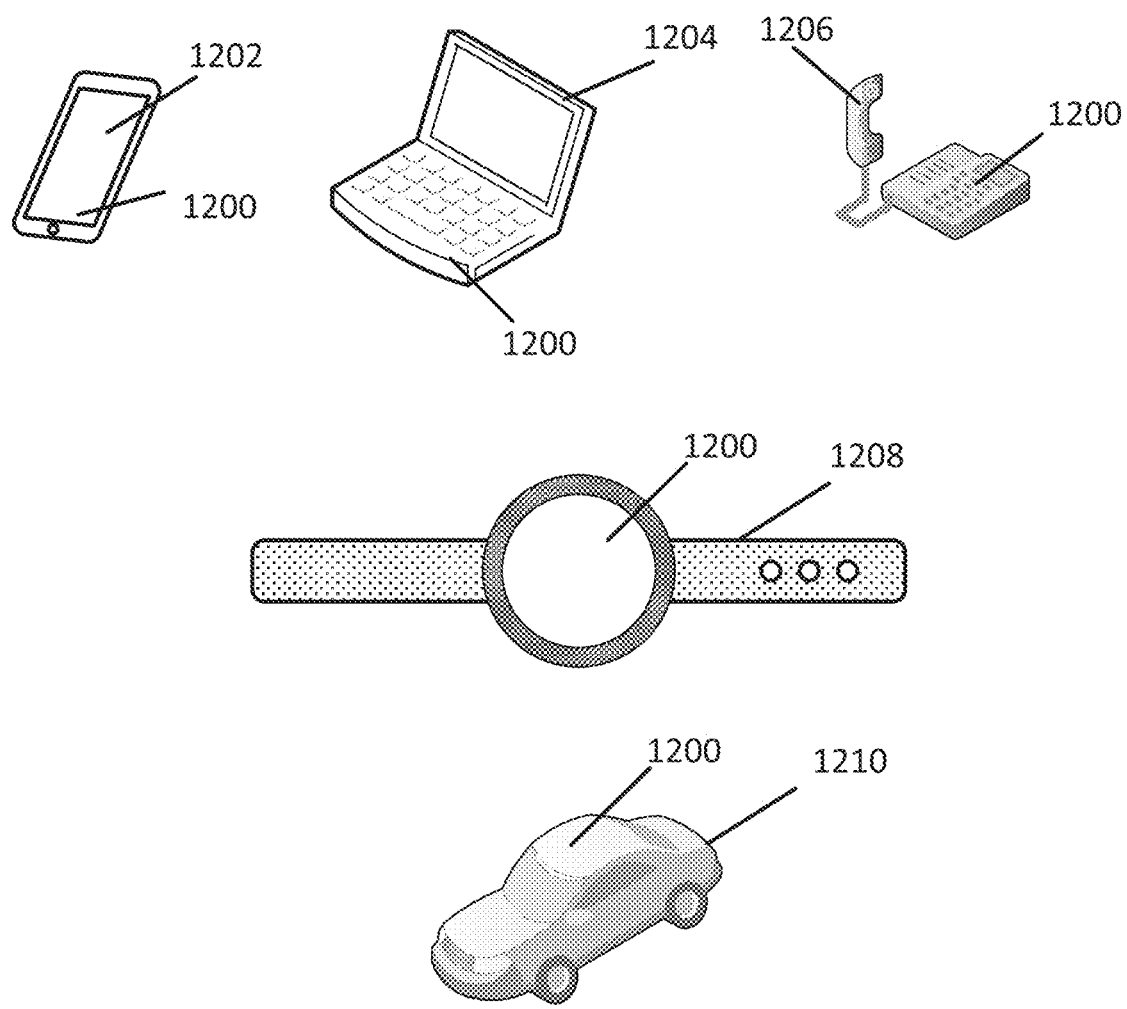
FIG. 12 illustrates various electronic devices that may integrate a die, an integrated device, an integrated passive device (IPD), a passive component, a package, and/or a device package described herein.

FIG. 12 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-4, 5A-5F, 6A-6B, 7, 8A-8B, 9-10, 11A-11C and/or 12 may be rearranged and/or combined into a single component, process, feature or function or embodied in several components, processes, or functions. Additional elements, components, processes, and/or functions may also be added without departing from the disclosure. It should also be noted FIGS. 2-4, 5A-5F, 6A-6B, 7, 8A-8B, 9-10, 11A-11C and/or 12 and its corresponding description in the present disclosure is not limited to dies and/or ICs. In some implementations, FIGS. 2-4, 5A-5F, 6A-6B, 7, 8A-8B, 9-10, 11A-11C and/or 12 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the following, further examples are described to facilitate the understanding of the invention.

In one further example, a package is described, the package comprising: a substrate comprising: (i) at least one inner dielectric layer, (ii) a plurality of interconnects located in the at least one inner dielectric layer, wherein the plurality of interconnects includes a pad located on a bottom metal layer of the substrate, (iii) an outer dielectric layer located over the at least one inner dielectric layer (e.g., over a surface of the at least one inner dielectric layer), (iv) at least one routing interconnect coupled to the plurality of interconnects, wherein the at least one routing interconnect is located over the outer dielectric layer (e.g., over a surface of the outer dielectric layer), wherein the at least one routing interconnect is located over the bottom metal layer of the substrate, and (v) a cover dielectric layer located over the outer dielectric layer and the at least one routing interconnect, an integrated device coupled to the substrate, and a solder interconnect coupled to the pad located on the bottom metal layer of the substrate. The outer dielectric layer may include a different material than the at least one inner dielectric layer. The cover dielectric layer may include a different material than the at least one inner dielectric layer. The cover dielectric layer may include a different material than the at least one inner dielectric layer and the outer dielectric layer. Further, the cover dielectric layer and the outer dielectric layer each may include a different material than the at least one inner dielectric layer. Further, the cover dielectric layer and the outer dielectric layer each may include a same material. The at least one inner dielectric layer may include a copper clad laminate (CCL) core, a prepreg, an ajinomoto build up film (ABF), and/or a resin coated copper (RCC). Also, the outer dielectric layer and the cover dielectric layer, each may include a solder resist layer and/or a photo imageable dielectric (PID). Further, a first electrical signal to and/or from the integrated device may be configured to travel through the at least one routing interconnect. Further, the package may comprise an encapsulation layer located over the substrate, at least one via located in the encapsulation layer, at least one upper routing interconnect coupled to the at least one via, wherein the at least one upper routing interconnect is located over the encapsulation layer, and an upper cover dielectric layer located over the at least one upper routing interconnect and the encapsulation layer. A first electrical signal to and/or from the integrated device may be configured to travel through the at least one upper routing interconnect. Further, the package may be part of a package on package (PoP). The bottom metal layer of the substrate may be a metal layer that is vertically closest to the solder interconnect without being laterally positioned next to the solder interconnect. The package may be incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

In yet another further example, an apparatus is described, the apparatus comprising: a substrate comprising: (i) at least one inner dielectric layer, (ii) a plurality of interconnects located in the at least one inner dielectric layer, wherein the plurality of interconnects includes a pad located on a bottom metal layer of the substrate, (iii) an outer dielectric layer located over the at least one inner dielectric layer, (iv) means for routing interconnect coupled to the plurality of interconnects, wherein the means for routing interconnect is located over the outer dielectric layer, wherein the means for routing interconnect is located over the bottom metal layer of the substrate, and (v) a cover dielectric layer located over the outer dielectric layer and the means for routing interconnect, an integrated device coupled to the substrate, and a solder interconnect coupled to the pad located on the bottom metal layer of the substrate. The outer dielectric layer may include a different material than the at least one inner dielectric layer. The cover dielectric layer may include a different material than the at least one inner dielectric layer. The cover dielectric layer may include a different material than the at least one inner dielectric layer and the outer dielectric layer. The cover dielectric layer and the outer dielectric layer each may include a different material than the at least one inner dielectric layer. The cover dielectric layer and the outer dielectric layer each may include a same material. A first electrical signal to and/or from the integrated device may be configured to travel through the means for routing interconnect. Also, the apparatus may comprise means for encapsulation located over the substrate, at least one via located in the means for encapsulation, means for upper routing interconnect coupled to the at least one via, wherein the means for upper routing interconnect is located over the means for encapsulation and an upper cover dielectric layer located over the means for upper routing interconnect and the means for encapsulation. Further, a first electrical signal to and/or from the integrated device may be configured to travel through the means for upper routing interconnect.

In yet another further example, a method for fabricating package may be described, the method comprising: providing a substrate comprising: (i) at least one inner dielectric layer, (ii) a plurality of interconnects located in the at least one inner dielectric layer, wherein the plurality of interconnects includes a pad located on a bottom metal layer of the substrate, (iii) an outer dielectric layer located over the at least one inner dielectric layer, (iv) at least one routing interconnect coupled to the plurality of interconnects, wherein the at least one routing interconnect is located over the outer dielectric layer, wherein the at least one routing interconnect is located over the bottom metal layer of the substrate, and (v) a cover dielectric layer located over the outer dielectric layer and the at least one routing interconnect, coupling an integrated device to the substrate and coupling a solder interconnect to the pad located on the bottom metal layer of the substrate. The method may further comprise forming an encapsulation layer over the substrate, forming at least one via in the encapsulation layer, forming at least one upper routing interconnect over the encapsulation layer, wherein the at least one upper routing interconnect is coupled to the at least one via, and forming an upper cover dielectric layer over the at least one upper routing interconnect and the encapsulation layer.

In one another example, a package is described, the package comprising: a substrate comprising: (i) at least one inner dielectric layer, (ii) a plurality of interconnects located in the at least one inner dielectric layer, wherein the plurality of interconnects includes a pad located on a bottom metal layer of the substrate, (iii) an outer dielectric layer located over the at least one inner dielectric layer (e.g., over a surface of the at least one inner dielectric layer), (iv) a cover dielectric layer located over the at least one inner dielectric layer (e.g., over a surface of the at least one inner dielectric layer), (v) at least one routing interconnect coupled to the plurality of interconnects, wherein the at least one routing interconnect is located over the cover dielectric layer (e.g., over a surface of the cover dielectric layer), wherein the at least one routing interconnect is located over the bottom metal layer of the substrate, and (v) a second outer dielectric layer located over the cover dielectric layer and the at least one routing interconnect, an integrated device coupled to the substrate, and a solder interconnect coupled to the pad located on the bottom metal layer of the substrate.

The invention claimed is:

1. A package comprising:
   a substrate comprising:
   (i) at least one inner dielectric layer;
   (ii) a plurality of interconnects located in the at least one inner dielectric layer, wherein the plurality of interconnects includes a pad located on a bottom metal layer of the substrate;
   (iii) an outer dielectric layer located over the at least one inner dielectric layer;
   (iv) at least one routing interconnect coupled to the plurality of interconnects,
      wherein the at least one routing interconnect is located over the outer dielectric layer,
      wherein the at least one routing interconnect is located over the bottom metal layer of the substrate, and
   (v) a cover dielectric layer located over the outer dielectric layer and the at least one routing interconnect;
   an integrated device coupled to the substrate; and
   a solder interconnect coupled to the pad located on the bottom metal layer of the substrate.

2. The package of claim 1, wherein the outer dielectric layer includes a different material than the at least one inner dielectric layer.

3. The package of claim 1, wherein the cover dielectric layer includes a different material than the at least one inner dielectric layer.

4. The package of claim 1, wherein the cover dielectric layer includes a different material than the at least one inner dielectric layer and the outer dielectric layer.

5. The package of claim 1, wherein the cover dielectric layer and the outer dielectric layer each includes a different material than the at least one inner dielectric layer.

6. The package of claim 1, wherein the cover dielectric layer and the outer dielectric layer each includes a same material.

7. The package of claim 1, wherein the at least one inner dielectric layer includes a copper clad laminate (CCL) core, a prepreg, an ajinomoto build up film (ABF), and/or a resin coated copper (RCC).

8. The package of claim 1, wherein the outer dielectric layer and the cover dielectric layer, each includes a solder resist layer and/or a photo imagable dielectric (PID).

9. The package of claim 1, wherein a first electrical signal to and/or from the integrated device is configured to travel through the at least one routing interconnect.

10. The package of claim 1, further comprising:
    an encapsulation layer located over the substrate;
    at least one via located in the encapsulation layer;
    at least one upper routing interconnect coupled to the at least one via, wherein the at least one upper routing interconnect is located over the encapsulation layer;
    an upper cover dielectric layer located over the at least one upper routing interconnect and the encapsulation layer,
    wherein the outer dielectric layer is located below a bottom surface of the at least one inner dielectric layer,
    wherein the at least one routing interconnect is located below bottom surface of the outer dielectric layer, and
    wherein the cover dielectric layer is located below the bottom surface of the outer dielectric layer and the at least one routing interconnect.

11. The package of claim 10, wherein a first electrical signal to and/or from the integrated device is configured to travel through the at least one upper routing interconnect.

12. The package of claim 10, wherein the package is part of a package on package (PoP).

13. The package of claim 1, wherein the bottom metal layer of the substrate is a metal layer that is vertically closest to the solder interconnect without being laterally positioned next to the solder interconnect.

14. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

15. An apparatus comprising:
    a substrate comprising:
    (i) at least one inner dielectric layer;
    (ii) a plurality of interconnects located in the at least one inner dielectric layer, wherein the plurality of interconnects includes a pad located on a bottom metal layer of the substrate;
    (iii) an outer dielectric layer located over the at least one inner dielectric layer;
    (iv) means for routing interconnect coupled to the plurality of interconnects,
       wherein the means for routing interconnect is located over the outer dielectric layer,
       wherein the means for routing interconnect is located over the bottom metal layer of the substrate, and
    (v) a cover dielectric layer located over the outer dielectric layer and the means for routing interconnect;
    an integrated device coupled to the substrate; and
    a solder interconnect coupled to the pad located on the bottom metal layer of the substrate.

16. The apparatus of claim 15, wherein the outer dielectric layer includes a different material than the at least one inner dielectric layer.

17. The apparatus of claim 15, wherein the cover dielectric layer includes a different material than the at least one inner dielectric layer.

18. The apparatus of claim 15, wherein the cover dielectric layer includes a different material than the at least one inner dielectric layer and the outer dielectric layer.

19. The apparatus of claim 15, wherein the cover dielectric layer and the outer dielectric layer each includes a different material than the at least one inner dielectric layer.

20. The apparatus of claim 15, wherein the cover dielectric layer and the outer dielectric layer each includes a same material.

21. The apparatus of claim 15, wherein a first electrical signal to and/or from the integrated device is configured to travel through the means for routing interconnect.

22. The apparatus of claim 15, further comprising:
means for encapsulation located over the substrate;
at least one via located in the means for encapsulation;
means for upper routing interconnect coupled to the at least one via, wherein the means for upper routing interconnect is located over the means for encapsulation; and
an upper cover dielectric layer located over the means for upper routing interconnect and the means for encapsulation.

23. The apparatus of claim 22, wherein a first electrical signal to and/or from the integrated device is configured to travel through the means for upper routing interconnect.

24. The apparatus of claim 15,
wherein the outer dielectric layer is (i) coupled to the at least one inner dielectric layer and (ii) located below the at least one inner dielectric layer,
wherein the means for routing interconnect is located below the outer dielectric layer, and
wherein the cover dielectric layer is (i) coupled to the outer dielectric layer and the means for routing interconnect, and (ii) located below the outer dielectric layer.

25. A package comprising:
a substrate comprising:
(i) at least one inner dielectric layer;
(ii) a plurality of interconnects located in the at least one inner dielectric layer, wherein the plurality of interconnects includes a pad located on a bottom metal layer of the substrate;
(iii) a first outer dielectric layer located over the at least one inner dielectric layer;
(iv) a cover dielectric layer located over the at least one inner dielectric layer;
(v) at least one routing interconnect coupled to the plurality of interconnects,
wherein the at least one routing interconnect is located over the cover dielectric layer,
wherein the at least one routing interconnect is located over the bottom metal layer of the substrate, and
(vi) a second outer dielectric layer located over the cover dielectric layer and the at least one routing interconnect;
an integrated device coupled to the substrate; and
a solder interconnect coupled to the pad located on the bottom metal layer of the substrate.

26. The package of claim 25, wherein the second outer dielectric layer and the first outer dielectric layer are a same dielectric layer.

27. A method for fabricating package, comprising:
providing a substrate comprising:
(i) at least one inner dielectric layer;
(ii) a plurality of interconnects located in the at least one inner dielectric layer, wherein the plurality of interconnects includes a pad located on a bottom metal layer of the substrate;
(iii) an outer dielectric layer located over the at least one inner dielectric layer;
(iv) at least one routing interconnect coupled to the plurality of interconnects,
wherein the at least one routing interconnect is located over the outer dielectric layer,
wherein the at least one routing interconnect is located over the bottom metal layer of the substrate, and
(v) a cover dielectric layer located over the outer dielectric layer and the at least one routing interconnect;
coupling an integrated device to the substrate; and
coupling a solder interconnect to the pad located on the bottom metal layer of the substrate.

28. The method of claim 27, further comprising:
forming an encapsulation layer over the substrate;
forming at least one via in the encapsulation layer;
forming at least one upper routing interconnect over the encapsulation layer, wherein the at least one upper routing interconnect is coupled to the at least one via; and
forming an upper cover dielectric layer over the at least one upper routing interconnect and the encapsulation layer.

* * * * *